United States Patent
Chaji et al.

(10) Patent No.: US 10,176,752 B2
(45) Date of Patent: Jan. 8, 2019

(54) INTEGRATED GATE DRIVER

(71) Applicant: Ignis Innovation Inc., Waterloo (CA)

(72) Inventors: Gholamreza Chaji, Waterloo (CA); Yaser Azizi, Waterloo (CA)

(73) Assignee: Ignis Innovation Inc., Waterloo, Ontario ( * ) Notice: Subject to any disclaimer, the term of this patent is extended or adjusted under 35 U.S.C. 154(b) by 145 days.

(21) Appl. No.: 14/666,372

(22) Filed: Mar. 24, 2015

(65) Prior Publication Data
US 2015/0269883 A1   Sep. 24, 2015

Related U.S. Application Data

(60) Provisional application No. 61/975,321, filed on Apr. 4, 2014, provisional application No. 61/969,533, filed on Mar. 24, 2014.

(51) Int. Cl.
*G09G 5/00*   (2006.01)
*G09G 3/3225*   (2016.01)
(Continued)

(52) U.S. Cl.
CPC ......... *G09G 3/3225* (2013.01); *G09G 3/3266* (2013.01); *G11C 19/28* (2013.01);
(Continued)

(58) Field of Classification Search
CPC ............... G09G 3/3225; G09G 3/3266; G09G 2310/0286; G09G 2310/08; G09G 2300/04; G11C 19/28
See application file for complete search history.

(56) References Cited

U.S. PATENT DOCUMENTS 4,354,162 A   10/1982   Wright
4,758,831 A   7/1988   Kasahara et al.
(Continued)

FOREIGN PATENT DOCUMENTS

CA   1294034   1/1992
CA   2109951   11/1992
(Continued)

OTHER PUBLICATIONS

Ahnood et al.: "Effect of threshold voltage instability on field effect mobility in thin film transistors deduced from constant current measurements"; dated Aug. 2009 (3 pages).
(Continued)

*Primary Examiner* — Matthew Sim
(74) *Attorney, Agent, or Firm* — Stratford Managers Corporation

(57) ABSTRACT

A gate driver suitable for integration with the backplane of an AMOLED display includes first and second clock signal sources producing first and second clock signals each having alternating active and inactive portions configured such that when one of the clock signals is active the other of the clock signals is inactive, and active portions of the first and second clock signals do not overlap. In a daisy chain of circuits for producing gate signals, each of the circuits except the last has an output coupled to the input of the next circuit in the chain. A source of a start token signal is coupled to an input of a first circuit in the daisy chain. Each of the circuits is configured to produce a gate signal one clock cycle after an active portion of one of the clock signals is received.

15 Claims, 10 Drawing Sheets

(51) Int. Cl.
    *G09G 3/3266*    (2016.01)
    *G11C 19/28*     (2006.01)
(52) U.S. Cl.
    CPC .............. *G09G 2300/0408* (2013.01); *G09G 2310/0286* (2013.01); *G09G 2310/08* (2013.01)

(56) References Cited

U.S. PATENT DOCUMENTS

| | | |
|---|---|---|
| 4,963,860 A | 10/1990 | Stewart |
| 4,975,691 A | 12/1990 | Lee |
| 4,996,523 A | 2/1991 | Bell et al. |
| 5,051,739 A | 9/1991 | Hayashida et al. |
| 5,222,082 A | 6/1993 | Plus |
| 5,266,515 A | 11/1993 | Robb et al. |
| 5,498,880 A | 3/1996 | Lee et al. |
| 5,589,847 A | 12/1996 | Lewis |
| 5,619,033 A | 4/1997 | Weisfield |
| 5,648,276 A | 7/1997 | Hara et al. |
| 5,670,973 A | 9/1997 | Bassetti et al. |
| 5,684,365 A | 11/1997 | Tang et al. |
| 5,686,935 A | 11/1997 | Weisbrod |
| 5,712,653 A | 1/1998 | Katoh et al. |
| 5,714,968 A | 2/1998 | Ikeda |
| 5,747,928 A | 5/1998 | Shanks et al. |
| 5,748,160 A | 5/1998 | Shieh et al. |
| 5,784,042 A | 7/1998 | Ono et al. |
| 5,790,234 A | 8/1998 | Matsuyama |
| 5,815,303 A | 9/1998 | Berlin |
| 5,870,071 A | 2/1999 | Kawahata |
| 5,874,803 A | 2/1999 | Garbuzov et al. |
| 5,880,582 A | 3/1999 | Sawada |
| 5,903,248 A | 5/1999 | Irwin |
| 5,917,280 A | 6/1999 | Burrows et al. |
| 5,923,794 A | 7/1999 | McGrath et al. |
| 5,952,789 A | 9/1999 | Stewart et al. |
| 5,990,629 A | 11/1999 | Yamada et al. |
| 6,023,259 A | 2/2000 | Howard et al. |
| 6,069,365 A | 5/2000 | Chow et al. |
| 6,081,131 A | 6/2000 | Ishii |
| 6,091,203 A | 7/2000 | Kawashima et al. |
| 6,097,360 A | 8/2000 | Holloman |
| 6,144,222 A | 11/2000 | Ho |
| 6,157,583 A | 12/2000 | Starnes et al. |
| 6,166,489 A | 12/2000 | Thompson et al. |
| 6,177,915 B1 | 1/2001 | Beeteson et al. |
| 6,225,846 B1 | 5/2001 | Wada et al. |
| 6,229,508 B1 | 5/2001 | Kane |
| 6,232,939 B1 | 5/2001 | Saito et al. |
| 6,246,180 B1 | 6/2001 | Nishigaki |
| 6,252,248 B1 | 6/2001 | Sano et al. |
| 6,259,424 B1 | 7/2001 | Kurogane |
| 6,274,887 B1 | 8/2001 | Yamazaki et al. |
| 6,288,696 B1 | 9/2001 | Holloman |
| 6,300,928 B1 | 10/2001 | Kim |
| 6,303,963 B1 | 10/2001 | Ohtani et al. |
| 6,306,694 B1 | 10/2001 | Yamazaki et al. |
| 6,307,322 B1 | 10/2001 | Dawson et al. |
| 6,316,786 B1 | 11/2001 | Mueller et al. |
| 6,320,325 B1 | 11/2001 | Cok et al. |
| 6,323,631 B1 | 11/2001 | Juang |
| 6,323,832 B1 | 11/2001 | Nishizawa et al. |
| 6,345,085 B1 | 2/2002 | Yeo et al. |
| 6,348,835 B1 | 2/2002 | Sato et al. |
| 6,365,917 B1 | 4/2002 | Yamazaki |
| 6,373,453 B1 | 4/2002 | Yudasaka |
| 6,384,427 B1 | 5/2002 | Yamazaki et al. |
| 6,392,617 B1 | 5/2002 | Gleason |
| 6,399,988 B1 | 6/2002 | Yamazaki |
| 6,414,661 B1 | 7/2002 | Shen et al. |
| 6,420,758 B1 | 7/2002 | Nakajima |
| 6,420,834 B2 | 7/2002 | Yamazaki et al. |
| 6,420,988 B1 | 7/2002 | Azami et al. |
| 6,433,488 B1 | 8/2002 | Bu |
| 6,445,376 B2 | 9/2002 | Parrish |
| 6,468,638 B2 | 10/2002 | Jacobsen et al. |
| 6,489,952 B1 | 12/2002 | Tanaka et al. |
| 6,501,098 B2 | 12/2002 | Yamazaki |
| 6,501,466 B1 | 12/2002 | Yamagashi et al. |
| 6,512,271 B1 | 1/2003 | Yamazaki et al. |
| 6,518,594 B1 | 2/2003 | Nakajima et al. |
| 6,524,895 B2 | 2/2003 | Yamazaki et al. |
| 6,531,713 B1 | 3/2003 | Yamazaki |
| 6,559,594 B2 | 5/2003 | Fukunaga et al. |
| 6,573,195 B1 | 6/2003 | Yamazaki et al. |
| 6,573,584 B1 | 6/2003 | Nagakari et al. |
| 6,576,926 B1 | 6/2003 | Yamazaki et al. |
| 6,580,408 B1 | 6/2003 | Bae et al. |
| 6,580,657 B2 | 6/2003 | Sanford et al. |
| 6,583,775 B1 | 6/2003 | Sekiya et al. |
| 6,583,776 B2 | 6/2003 | Yamazaki et al. |
| 6,587,086 B1 | 7/2003 | Koyama |
| 6,593,691 B2 | 7/2003 | Nishi et al. |
| 6,594,606 B2 | 7/2003 | Everitt |
| 6,597,203 B2 | 7/2003 | Forbes |
| 6,611,108 B2 | 8/2003 | Kimura |
| 6,617,644 B1 | 9/2003 | Yamazaki et al. |
| 6,618,030 B2 | 9/2003 | Kane et al. |
| 6,641,933 B1 | 11/2003 | Yamazaki et al. |
| 6,661,180 B2 | 12/2003 | Koyama |
| 6,661,397 B2 | 12/2003 | Mikami et al. |
| 6,670,637 B2 | 12/2003 | Yamazaki et al. |
| 6,677,713 B1 | 1/2004 | Sung |
| 6,680,577 B1 | 1/2004 | Inukai et al. |
| 6,687,266 B1 | 2/2004 | Ma et al. |
| 6,690,344 B1 | 2/2004 | Takeuchi et al. |
| 6,693,388 B2 | 2/2004 | Oomura |
| 6,693,610 B2 | 2/2004 | Shannon et al. |
| 6,697,057 B2 | 2/2004 | Koyama et al. |
| 6,720,942 B2 | 4/2004 | Lee et al. |
| 6,734,636 B2 | 5/2004 | Sanford et al. |
| 6,738,034 B2 | 5/2004 | Kaneko et al. |
| 6,738,035 B1 | 5/2004 | Fan |
| 6,771,028 B1 | 8/2004 | Winters |
| 6,777,712 B2 | 8/2004 | Sanford et al. |
| 6,780,687 B2 | 8/2004 | Nakajima et al. |
| 6,806,638 B2 | 10/2004 | Lih et al. |
| 6,806,857 B2 | 10/2004 | Sempel et al. |
| 6,809,706 B2 | 10/2004 | Shimoda |
| 6,859,193 B1 | 2/2005 | Yumoto |
| 6,861,670 B1 | 3/2005 | Ohtani et al. |
| 6,873,117 B2 | 3/2005 | Ishizuka |
| 6,873,320 B2 | 3/2005 | Nakamura |
| 6,878,968 B1 | 4/2005 | Ohnuma |
| 6,909,114 B1 | 6/2005 | Yamazaki |
| 6,909,419 B2 | 6/2005 | Zavracky et al. |
| 6,919,871 B2 | 7/2005 | Kwon |
| 6,937,215 B2 | 8/2005 | Lo |
| 6,940,214 B1 | 9/2005 | Komiya et al. |
| 6,943,500 B2 | 9/2005 | LeChevalier |
| 6,954,194 B2 | 10/2005 | Matsumoto et al. |
| 6,956,547 B2 | 10/2005 | Bae et al. |
| 6,995,510 B2 | 2/2006 | Murakami et al. |
| 6,995,519 B2 | 2/2006 | Arnold et al. |
| 7,022,556 B1 | 4/2006 | Adachi |
| 7,023,408 B2 | 4/2006 | Chen et al. |
| 7,027,015 B2 | 4/2006 | Booth, Jr. et al. |
| 7,034,793 B2 | 4/2006 | Sekiya et al. |
| 7,088,051 B1 | 8/2006 | Cok |
| 7,106,285 B2 | 9/2006 | Naugler |
| 7,116,058 B2 | 10/2006 | Lo et al. |
| 7,129,914 B2 | 10/2006 | Knapp et al. |
| 7,129,917 B2 | 10/2006 | Yamazaki et al. |
| 7,141,821 B1 | 11/2006 | Yamazaki et al. |
| 7,161,566 B2 | 1/2007 | Cok et al. |
| 7,193,589 B2 | 3/2007 | Yoshida et al. |
| 7,199,516 B2 | 4/2007 | Seo et al. |
| 7,220,997 B2 | 5/2007 | Nakata |
| 7,235,810 B1 | 6/2007 | Yamazaki et al. |
| 7,245,277 B2 | 7/2007 | Ishizuka |
| 7,248,236 B2 | 7/2007 | Nathan et al. |
| 7,264,979 B2 | 9/2007 | Yamagata et al. |
| 7,274,345 B2 | 9/2007 | Imamura et al. |
| 7,274,363 B2 | 9/2007 | Ishizuka et al. |

(56) References Cited

U.S. PATENT DOCUMENTS

| | | |
|---|---|---|
| 7,279,711 B1 | 10/2007 | Yamazaki et al. |
| 7,304,621 B2 | 12/2007 | Oomori et al. |
| 7,310,092 B2 | 12/2007 | Imamura |
| 7,315,295 B2 | 1/2008 | Kimura |
| 7,317,429 B2 | 1/2008 | Shirasaki et al. |
| 7,319,465 B2 | 1/2008 | Mikami et al. |
| 7,321,348 B2 | 1/2008 | Cok et al. |
| 7,339,636 B2 | 3/2008 | Voloschenko et al. |
| 7,355,574 B1 | 4/2008 | Leon et al. |
| 7,358,941 B2 | 4/2008 | Ono et al. |
| 7,402,467 B1 | 7/2008 | Kadono et al. |
| 7,414,600 B2 | 8/2008 | Nathan et al. |
| 7,432,885 B2 | 10/2008 | Asano et al. |
| 7,474,285 B2 | 1/2009 | Kimura |
| 7,485,478 B2 | 2/2009 | Yamagata et al. |
| 7,502,000 B2 | 3/2009 | Yuki et al. |
| 7,535,449 B2 | 5/2009 | Miyazawa |
| 7,554,512 B2 | 6/2009 | Steer |
| 7,569,849 B2 | 8/2009 | Nathan et al. |
| 7,619,594 B2 | 11/2009 | Hu |
| 7,619,597 B2 | 11/2009 | Nathan et al. |
| 7,697,052 B1 | 4/2010 | Yamazaki et al. |
| 7,825,419 B2 | 11/2010 | Yamagata et al. |
| 7,859,492 B2 | 12/2010 | Kohno |
| 7,868,859 B2 | 1/2011 | Tomida et al. |
| 7,876,294 B2 | 1/2011 | Sasaki et al. |
| 7,948,170 B2 | 5/2011 | Striakhilev et al. |
| 7,969,390 B2 | 6/2011 | Yoshida |
| 7,995,010 B2 | 8/2011 | Yamazaki et al. |
| 8,044,893 B2 | 10/2011 | Nathan et al. |
| 8,115,707 B2 | 2/2012 | Nathan et al. |
| 8,378,362 B2 | 2/2013 | Heo et al. |
| 8,493,295 B2 | 7/2013 | Yamazaki et al. |
| 8,497,525 B2 | 7/2013 | Yamagata et al. |
| 2001/0002703 A1 | 6/2001 | Koyama |
| 2001/0004190 A1 | 6/2001 | Nishi et al. |
| 2001/0013806 A1 | 8/2001 | Notani |
| 2001/0015653 A1 | 8/2001 | De Jong et al. |
| 2001/0020926 A1 | 9/2001 | Kujik |
| 2001/0026127 A1 | 10/2001 | Yoneda et al. |
| 2001/0026179 A1 | 10/2001 | Saeki |
| 2001/0026257 A1 | 10/2001 | Kimura |
| 2001/0030323 A1 | 10/2001 | Ikeda |
| 2001/0033199 A1 | 10/2001 | Aoki |
| 2001/0038098 A1 | 11/2001 | Yamazaki et al. |
| 2001/0043173 A1 | 11/2001 | Troutman |
| 2001/0045929 A1 | 11/2001 | Prache et al. |
| 2001/0052606 A1 | 12/2001 | Sempel et al. |
| 2001/0052898 A1 | 12/2001 | Osame et al. |
| 2002/0000576 A1 | 1/2002 | Inukai |
| 2002/0011796 A1 | 1/2002 | Koyama |
| 2002/0011799 A1 | 1/2002 | Kimura |
| 2002/0011981 A1 | 1/2002 | Kujik |
| 2002/0015031 A1 | 2/2002 | Fujita et al. |
| 2002/0015032 A1 | 2/2002 | Koyama et al. |
| 2002/0030528 A1 | 3/2002 | Matsumoto et al. |
| 2002/0030647 A1 | 3/2002 | Hack et al. |
| 2002/0036463 A1 | 3/2002 | Yoneda et al. |
| 2002/0047852 A1 | 4/2002 | Inukai et al. |
| 2002/0048829 A1 | 4/2002 | Yamazaki et al. |
| 2002/0050795 A1 | 5/2002 | Imura |
| 2002/0053401 A1 | 5/2002 | Ishikawa et al. |
| 2002/0070909 A1 | 6/2002 | Asano et al. |
| 2002/0080108 A1 | 6/2002 | Wang |
| 2002/0084463 A1 | 7/2002 | Sanford et al. |
| 2002/0101172 A1 | 8/2002 | Bu |
| 2002/0101433 A1 | 8/2002 | McKnight |
| 2002/0113248 A1 | 8/2002 | Yamagata et al. |
| 2002/0122308 A1 | 9/2002 | Ikeda |
| 2002/0130686 A1 | 9/2002 | Forbes |
| 2002/0154084 A1 | 10/2002 | Tanaka et al. |
| 2002/0158823 A1 | 10/2002 | Zavracky et al. |
| 2002/0163314 A1 | 11/2002 | Yamazaki et al. |
| 2002/0167471 A1 | 11/2002 | Everitt |
| 2002/0180369 A1 | 12/2002 | Koyama |
| 2002/0180721 A1 | 12/2002 | Kimura et al. |
| 2002/0186214 A1 | 12/2002 | Siwinski |
| 2002/0190332 A1 | 12/2002 | Lee et al. |
| 2002/0190924 A1 | 12/2002 | Asano et al. |
| 2002/0190971 A1 | 12/2002 | Nakamura et al. |
| 2002/0195967 A1 | 12/2002 | Kim et al. |
| 2002/0195968 A1 | 12/2002 | Sanford et al. |
| 2003/0020413 A1 | 1/2003 | Oomura |
| 2003/0030603 A1 | 2/2003 | Shimoda |
| 2003/0062524 A1 | 4/2003 | Kimura |
| 2003/0063081 A1 | 4/2003 | Kimura et al. |
| 2003/0071804 A1 | 4/2003 | Yamazaki et al. |
| 2003/0076048 A1 | 4/2003 | Rutherford |
| 2003/0090445 A1 | 5/2003 | Chen et al. |
| 2003/0090447 A1 | 5/2003 | Kimura |
| 2003/0090481 A1 | 5/2003 | Kimura |
| 2003/0095087 A1 | 5/2003 | Libsch |
| 2003/0107560 A1 | 6/2003 | Yumoto et al. |
| 2003/0111966 A1 | 6/2003 | Mikami et al. |
| 2003/0122745 A1 | 7/2003 | Miyazawa |
| 2003/0140958 A1 | 7/2003 | Yang et al. |
| 2003/0151569 A1 | 8/2003 | Lee et al. |
| 2003/0169219 A1 | 9/2003 | LeChevalier |
| 2003/0174152 A1 | 9/2003 | Noguchi |
| 2003/0179626 A1 | 9/2003 | Sanford et al. |
| 2003/0197663 A1 | 10/2003 | Lee et al. |
| 2003/0206060 A1 | 11/2003 | Suzuki |
| 2003/0230980 A1 | 12/2003 | Forrest et al. |
| 2004/0027063 A1 | 2/2004 | Nishikawa |
| 2004/0056604 A1 | 3/2004 | Shih et al. |
| 2004/0066357 A1 | 4/2004 | Kawasaki |
| 2004/0070557 A1 | 4/2004 | Asano et al. |
| 2004/0080262 A1 | 4/2004 | Park et al. |
| 2004/0080470 A1 | 4/2004 | Yamazaki et al. |
| 2004/0090400 A1 | 5/2004 | Yoo |
| 2004/0108518 A1 | 6/2004 | Jo |
| 2004/0113903 A1 | 6/2004 | Mikami et al. |
| 2004/0129933 A1 | 7/2004 | Nathan et al. |
| 2004/0130516 A1 | 7/2004 | Nathan et al. |
| 2004/0135749 A1 | 7/2004 | Kondakov et al. |
| 2004/0145547 A1 | 7/2004 | Oh |
| 2004/0150592 A1 | 8/2004 | Mizukoshi et al. |
| 2004/0150594 A1 | 8/2004 | Koyama et al. |
| 2004/0150595 A1 | 8/2004 | Kasai |
| 2004/0155841 A1 | 8/2004 | Kasai |
| 2004/0174347 A1 | 9/2004 | Sun et al. |
| 2004/0174349 A1 | 9/2004 | Libsch |
| 2004/0183759 A1 | 9/2004 | Stevenson et al. |
| 2004/0189627 A1 | 9/2004 | Shirasaki et al. |
| 2004/0196275 A1 | 10/2004 | Hattori |
| 2004/0201554 A1 | 10/2004 | Satoh |
| 2004/0207615 A1 | 10/2004 | Yumoto |
| 2004/0233125 A1 | 11/2004 | Tanghe et al. |
| 2004/0239596 A1 | 12/2004 | Ono et al. |
| 2004/0252089 A1 | 12/2004 | Ono et al. |
| 2004/0257355 A1 | 12/2004 | Naugler |
| 2004/0263437 A1 | 12/2004 | Hattori |
| 2005/0007357 A1 | 1/2005 | Yamashita et al. |
| 2005/0030267 A1 | 2/2005 | Tanghe et al. |
| 2005/0035709 A1 | 2/2005 | Furuie et al. |
| 2005/0067970 A1 | 3/2005 | Libsch et al. |
| 2005/0067971 A1 | 3/2005 | Kane |
| 2005/0068270 A1 | 3/2005 | Awakura |
| 2005/0088085 A1 | 4/2005 | Nishikawa et al. |
| 2005/0088103 A1 | 4/2005 | Kageyama et al. |
| 2005/0110420 A1 | 5/2005 | Arnold et al. |
| 2005/0117096 A1 | 6/2005 | Voloschenko et al. |
| 2005/0140598 A1 | 6/2005 | Kim et al. |
| 2005/0140610 A1 | 6/2005 | Smith et al. |
| 2005/0145891 A1 | 7/2005 | Abe |
| 2005/0156831 A1 | 7/2005 | Yamazaki et al. |
| 2005/0168416 A1 | 8/2005 | Hashimoto et al. |
| 2005/0206590 A1 | 9/2005 | Sasaki et al. |
| 2005/0225686 A1 | 10/2005 | Brummack et al. |
| 2005/0260777 A1 | 11/2005 | Brabec et al. |
| 2005/0269959 A1 | 12/2005 | Uchino et al. |
| 2005/0269960 A1 | 12/2005 | Ono et al. |
| 2005/0285822 A1 | 12/2005 | Reddy et al. |

(56) References Cited

U.S. PATENT DOCUMENTS

| | | | |
|---|---|---|---|
| 2005/0285824 A1* | 12/2005 | Shin | G09G 3/325 345/76 |
| 2005/0285825 A1 | 12/2005 | Eom et al. | |
| 2006/0007072 A1 | 1/2006 | Choi et al. | |
| 2006/0012310 A1 | 1/2006 | Chen et al. | |
| 2006/0027807 A1 | 2/2006 | Nathan et al. | |
| 2006/0030084 A1 | 2/2006 | Young | |
| 2006/0038758 A1 | 2/2006 | Routley et al. | |
| 2006/0044227 A1 | 3/2006 | Hadcock | |
| 2006/0066527 A1 | 3/2006 | Chou | |
| 2006/0092185 A1 | 5/2006 | Jo et al. | |
| 2006/0221042 A1* | 10/2006 | Cho | G09G 3/20 345/100 |
| 2006/0232522 A1 | 10/2006 | Roy et al. | |
| 2006/0261841 A1 | 11/2006 | Fish | |
| 2006/0264143 A1 | 11/2006 | Lee et al. | |
| 2006/0273997 A1 | 12/2006 | Nathan et al. | |
| 2006/0284801 A1 | 12/2006 | Yoon et al. | |
| 2007/0001937 A1 | 1/2007 | Park et al. | |
| 2007/0001939 A1 | 1/2007 | Hashimoto et al. | |
| 2007/0008268 A1 | 1/2007 | Park et al. | |
| 2007/0008297 A1 | 1/2007 | Bassetti | |
| 2007/0046195 A1 | 3/2007 | Chin et al. | |
| 2007/0069998 A1 | 3/2007 | Naugler et al. | |
| 2007/0080905 A1 | 4/2007 | Takahara | |
| 2007/0080906 A1 | 4/2007 | Tanabe | |
| 2007/0080908 A1 | 4/2007 | Nathan et al. | |
| 2007/0080918 A1 | 4/2007 | Kawachi et al. | |
| 2007/0103419 A1 | 5/2007 | Uchino et al. | |
| 2007/0182671 A1 | 8/2007 | Nathan et al. | |
| 2007/0273294 A1 | 11/2007 | Nagayama | |
| 2007/0285359 A1 | 12/2007 | Ono | |
| 2007/0296672 A1 | 12/2007 | Kim et al. | |
| 2008/0042948 A1 | 2/2008 | Yamashita et al. | |
| 2008/0055209 A1 | 3/2008 | Cok | |
| 2008/0074413 A1 | 3/2008 | Ogura | |
| 2008/0088549 A1 | 4/2008 | Nathan et al. | |
| 2008/0101529 A1* | 5/2008 | Tobita | G09G 3/3677 377/64 |
| 2008/0122803 A1 | 5/2008 | Izadi et al. | |
| 2008/0230118 A1 | 9/2008 | Nakatani et al. | |
| 2009/0032807 A1 | 2/2009 | Shinohara et al. | |
| 2009/0051283 A1 | 2/2009 | Cok et al. | |
| 2009/0160743 A1 | 6/2009 | Tomida et al. | |
| 2009/0162961 A1 | 6/2009 | Deane | |
| 2009/0174628 A1 | 7/2009 | Wang et al. | |
| 2009/0213046 A1 | 8/2009 | Nam | |
| 2010/0052524 A1 | 3/2010 | Kinoshita | |
| 2010/0078230 A1 | 4/2010 | Rosenblatt et al. | |
| 2010/0079711 A1 | 4/2010 | Tanaka | |
| 2010/0097335 A1 | 4/2010 | Jung et al. | |
| 2010/0133994 A1 | 6/2010 | Song et al. | |
| 2010/0134456 A1 | 6/2010 | Oyamada | |
| 2010/0156279 A1 | 6/2010 | Tamura et al. | |
| 2010/0237374 A1 | 9/2010 | Chu et al. | |
| 2010/0328294 A1 | 12/2010 | Sasaki et al. | |
| 2011/0090210 A1 | 4/2011 | Sasaki et al. | |
| 2011/0133636 A1 | 6/2011 | Matsuo et al. | |
| 2011/0180825 A1 | 7/2011 | Lee et al. | |
| 2012/0212468 A1 | 8/2012 | Govil | |
| 2013/0009930 A1 | 1/2013 | Cho et al. | |
| 2013/0032831 A1 | 2/2013 | Chaji et al. | |
| 2013/0113785 A1 | 5/2013 | Sumi | |

FOREIGN PATENT DOCUMENTS

| | | |
|---|---|---|
| CA | 2 249 592 | 7/1998 |
| CA | 2 368 386 | 9/1999 |
| CA | 2 242 720 | 1/2000 |
| CA | 2 354 018 | 6/2000 |
| CA | 2 436 451 | 8/2002 |
| CA | 2 438 577 | 8/2002 |
| CA | 2 483 645 | 12/2003 |
| CA | 2 463 653 | 1/2004 |
| CA | 2498136 | 3/2004 |
| CA | 2522396 | 11/2004 |
| CA | 2443206 | 3/2005 |
| CA | 2472671 | 12/2005 |
| CA | 2567076 | 1/2006 |
| CA | 2526782 | 4/2006 |
| CN | 1381032 | 11/2002 |
| CN | 1448908 | 10/2003 |
| DE | 20 2006 005427 | 6/2006 |
| EP | 0 940 796 | 9/1999 |
| EP | 1 028 471 A | 8/2000 |
| EP | 1 103 947 | 5/2001 |
| EP | 1 130 565 A1 | 9/2001 |
| EP | 1 184 833 | 3/2002 |
| EP | 1 194 013 | 4/2002 |
| EP | 1 310 939 | 5/2003 |
| EP | 1 335 430 A1 | 8/2003 |
| EP | 1 372 136 | 12/2003 |
| EP | 1 381 019 | 1/2004 |
| EP | 1 418 566 | 5/2004 |
| EP | 1 429 312 A | 6/2004 |
| EP | 1 439 520 | 7/2004 |
| EP | 1 465 143 A | 10/2004 |
| EP | 1 467 408 | 10/2004 |
| EP | 1 517 290 | 3/2005 |
| EP | 1 521 203 A2 | 4/2005 |
| EP | 2317499 | 5/2011 |
| GB | 2 205 431 | 12/1988 |
| JP | 09 090405 | 4/1997 |
| JP | 10-153759 | 6/1998 |
| JP | 10-254410 | 9/1998 |
| JP | 11 231805 | 8/1999 |
| JP | 11-282419 | 10/1999 |
| JP | 2000/056847 | 2/2000 |
| JP | 2000-077192 | 3/2000 |
| JP | 2000-089198 | 3/2000 |
| JP | 2000-352941 | 12/2000 |
| JP | 2002-91376 | 3/2002 |
| JP | 2002-268576 | 9/2002 |
| JP | 2002-278513 | 9/2002 |
| JP | 2002-333862 | 11/2002 |
| JP | 2003-022035 | 1/2003 |
| JP | 2003-076331 | 3/2003 |
| JP | 2003-150082 | 5/2003 |
| JP | 2003-177709 | 6/2003 |
| JP | 2003-271095 | 9/2003 |
| JP | 2003-308046 | 10/2003 |
| JP | 2005-057217 | 3/2005 |
| JP | 2006065148 | 3/2006 |
| JP | 2009282158 | 12/2009 |
| TW | 485337 | 5/2002 |
| TW | 502233 | 9/2002 |
| TW | 538650 | 6/2003 |
| TW | 569173 | 1/2004 |
| WO | WO 94/25954 | 11/1994 |
| WO | WO 99/48079 | 9/1999 |
| WO | WO 01/27910 A1 | 4/2001 |
| WO | WO 02/067327 A | 8/2002 |
| WO | WO 03/034389 A | 4/2003 |
| WO | WO 03/063124 | 7/2003 |
| WO | WO 03/077231 | 9/2003 |
| WO | WO 03/105117 | 12/2003 |
| WO | WO 2004/003877 | 1/2004 |
| WO | WO 2004/034364 | 4/2004 |
| WO | WO 2005/022498 | 3/2005 |
| WO | WO 2005/029455 | 3/2005 |
| WO | WO 2005/055185 | 6/2005 |
| WO | WO 2006/053424 | 5/2006 |
| WO | WO 2006/063448 A | 6/2006 |
| WO | WO 2006/137337 | 12/2006 |
| WO | WO 2007/003877 A | 1/2007 |
| WO | WO 2007/079572 | 7/2007 |
| WO | WO 2010/023270 | 3/2010 |

OTHER PUBLICATIONS

Alexander et al.: "Pixel circuits and drive schemes for glass and elastic AMOLED displays"; dated Jul. 2005 (9 pages).

(56) References Cited

OTHER PUBLICATIONS

Alexander et al.: "Unique Electrical Measurement Technology for Compensation, Inspection, and Process Diagnostics of AMOLED HDTV"; dated May 2010 (4 pages).
Ashtiani et al.: "AMOLED Pixel Circuit With Electronic Compensation of Luminance Degradation"; dated Mar. 2007 (4 pages).
Chaji et al.: "A Current-Mode Comparator for Digital Calibration of Amorphous Silicon AMOLED Displays"; dated Jul. 2008 (5 pages).
Chaji et al.: "A fast settling current driver based on the CCII for AMOLED displays"; dated Dec. 2009 (6 pages).
Chaji et al.: "A Low-Cost Stable Amorphous Silicon AMOLED Display with Full V~T- and V~O~L~E~D Shift Compensation"; dated May 2007 (4 pages).
Chaji et al.: "A low-power driving scheme for a-Si:H active-matrix organic light-emitting diode displays"; dated Jun. 2005 (4 pages).
Chaji et al.: "A low-power high-performance digital circuit for deep submicron technologies"; dated Jun. 2005 (4 pages).
Chaji et al.: "A novel a-Si:H AMOLED pixel circuit based on short-term stress stability of a-Si:H TFTs"; dated Oct. 2005 (3 pages).
Chaji et al.: "A Novel Driving Scheme and Pixel Circuit for AMOLED Displays"; dated Jun. 2006 (4 pages).
Chaji et al.: "A novel driving scheme for high-resolution large-area a-Si:H AMOLED displays"; dated Aug. 2005 (4 pages).
Chaji et al.: "A Stable Voltage-Programmed Pixel Circuit for a-Si:H AMOLED Displays"; dated Dec. 2006 (12 pages).
Chaji et al.: "A Sub-µA fast-settling current-programmed pixel circuit for AMOLED displays"; dated Sep. 2007.
Chaji et al.: "An Enhanced and Simplified Optical Feedback Pixel Circuit for AMOLED Displays"; dated Oct. 2006.
Chaji et al.: "Compensation technique for DC and transient instability of thin film transistor circuits for large-area devices"; dated Aug. 2008.
Chaji et al.: "Driving scheme for stable operation of 2-TFT a-Si AMOLED pixel"; dated Apr. 2005 (2 pages).
Chaji et al.: "Dynamic-effect compensating technique for stable a-Si:H AMOLED displays"; dated Aug. 2005 (4 pages).
Chaji et al.: "Electrical Compensation of OLED Luminance Degradation"; dated Dec. 2007 (3 pages).
Chaji et al.: "eUTDSP: a design study of a new VLIW-based DSP architecture"; dated My 2003 (4 pages).
Chaji et al.: "Fast and Offset-Leakage Insensitive Current-Mode Line Driver for Active Matrix Displays and Sensors"; dated Feb. 2009 (8 pages).
Chaji et al.: "High Speed Low Power Adder Design With a New Logic Style: Pseudo Dynamic Logic (SDL)"; dated Oct. 2001 (4 pages).
Chaji et al.: "High-precision, fast current source for large-area current-programmed a-Si flat panels"; dated Sep. 2006 (4 pages).
Chaji et al.: "Low-Cost AMOLED Television with IGNIS Compensating Technology"; dated May 2008 (4 pages).
Chaji et al.: "Low-Cost Stable a-Si:H AMOLED Display for Portable Applications"; dated Jun. 2006 (4 pages).
Chaji et al.: "Low-Power Low-Cost Voltage-Programmed a-Si:H AMOLED Display"; dated Jun. 2008 (5 pages).
Chaji et al.: "Merged phototransistor pixel with enhanced near infrared response and flicker noise reduction for biomolecular imaging"; dated Nov. 2008 (3 pages).
Chaji et al.: "Parallel Addressing Scheme for Voltage-Programmed Active-Matrix OLED Displays"; dated May 2007 (6 pages).
Chaji et al.: "Pseudo dynamic logic (SDL): a high-speed and low-power dynamic logic family"; dated 2002 (4 pages).
Chaji et al.: "Stable a-Si:H circuits based on short-term stress stability of amorphous silicon thin film transistors"; dated May 2006 (4 pages).
Chaji et al.: "Stable Pixel Circuit for Small-Area High- Resolution a-Si:H AMOLED Displays"; dated Oct. 2008 (6 pages).
Chaji et al.: "Stable RGBW AMOLED display with OLED degradation compensation using electrical feedback"; dated Feb. 2010 (2 pages).
Chaji et al.: "Thin-Film Transistor Integration for Biomedical Imaging and AMOLED Displays"; dated 2008 (177 pages).
European Search Report and Written Opinion for Application No. 08 86 5338 dated Nov. 2, 2011 (7 pages).
European Search Report for European Application No. EP 04 78 6661 dated Mar. 9, 2009.
European Search Report for European Application No. EP 05 75 9141 dated Oct. 30, 2009.
European Search Report for European Application No. EP 05 82 1114 dated Mar. 27, 2009.
European Search Report for European Application No. EP 07 71 9579 dated May 20, 2009.
European Search Report dated Mar. 26, 2012 in corresponding European Patent Application No. 10000421.7 (6 pages).
Extended European Search Report dated Apr. 27, 2011 issued during prosecution of European patent application No. 09733076.5 (13 pages).
Goh et al., "A New a-Si:H Thin Film Transistor Pixel Circul for Active-Matrix Organic Light-Emitting Diodes", IEEE Electron Device Letters, vol. 24, No. 9, Sep. 2003, 4 pages.
International Search Report for International Application No. PCT/CA02/00180 dated Jul. 31, 2002 (3 pages).
International Search Report for International Application No. PCT/CA2004/001741 dated Feb. 21, 2005.
International Search Report for International Application No. PCT/CA2005/001844 dated Mar. 28, 2006 (2 pages).
International Search Report for International Application No. PCT/CA2005/001007 dated Oct. 18, 2005.
International Search Report for International Application No. PCT/CA2007/000652 dated Jul. 25, 2007.
International Search Report for International Application No. PCT/CA2008/002307, dated Apr. 28. 2009 (3 pages).
International Search Report for International Application No. PCT/IB2011/055135, Canadian Patent Office, dated Apr. 16, 2012 (5 pages).
International Search Report dated Jul. 30, 2009 for International Application No. PCT/CA2009/000501 (4 pages).
Jafarabadiashtiani et al.: "A New Driving Method for a-Si AMOLED Displays Based on Voltage Feedback"; dated 2005 (4 pages).
Lee et al.: "Ambipolar Thin-Film Transistors Fabricated by PECVD Nanocrystalline Silicon"; dated 2006 (6 pages).
Ma e y et al: "Organic Light-Emitting Diode/Thin Film Transistor Integration for foldable Displays" Conference record of the 1997 International display research conference and international workshops on LCD technology and emissive technology. Toronto, Sep. 15-19, 1997 (6 pages).
Matsueda y et al.: "35.1: 2.5-in. AMOLED with Integrated 6-bit Gamma Compensated Digital Data Driver"; dated May 2004.
Nathan et al.: "Backplane Requirements for Active Matrix Organic Light Emitting Diode Displays"; dated 2006 (16 pages).
Nathan et al.: "Call for papers second international workshop on compact thin-film transistor (TFT) modeling for circuit simulation"; dated Sep. 2009 (1 page).
Nathan et al.: "Driving schemes for a-Si and LTPS AMOLED displays"; dated Dec. 2005 (11 pages).
Nathan et al.: "Invited Paper: a -Si for AMOLED—Meeting the Performance and Cost Demands of Display Applications (Cell Phone to HDTV)", dated 2006 (4 pages).
Nathan et al.: "Thin film imaging technology on glass and plastic" ICM 2000, Proceedings of the 12$^{th}$ International Conference on Microelectronics, (IEEE Cat. No. 00EX453), Tehran Iran; dated Oct. 31-Nov. 2, 2000, pp. 11-14, ISBN: 964-360-057-2, p. 13, col. 1, line 11-48; (4 pages).
Nathan et al., "Amorphous Silicon Thin Film Transistor Circuit Integration for Organic LED Displays on Glass and Plastic", IEEE Journal of Solid-State Circuits, vol. 39, No. 9, Sep. 2004, pp. 1477-1486.
Office Action issued in Chinese Patent Application 200910246264.4 dated Jul. 5, 2013; 8 pages.
Patent Abstracts of Japan, vol. 2000, No. 09, Oct. 13, 2000—JP 2000 172199 A, Jun. 3, 2000, abstract.
Patent Abstracts of Japan, vol. 2002, No. 03, Apr. 3, 2002 (Apr. 4, 2004 & JP 2001 318627 A (Semiconductor EnergyLab DO LTD),

(56) References Cited

OTHER PUBLICATIONS

Nov. 16, 2001, abstract, paragraphs '01331-01801, paragraph '01691, paragraph '01701, paragraph '01721 and figure 10.

Philipp: "Charge transfer sensing" Sensor Review, vol. 19, No. 2, Dec. 31, 1999 (Dec. 31, 1999), 10 pages.

Rafati et al.: "Comparison of a 17 b multiplier in Dual-rail domino and in Dual-rail D L (D L) logic styles"; dated 2002 (4 pages).

Safavaian et al.: "Three-TFT image sensor for real-time digital X-ray imaging"; dated Feb. 2, 2006 (2 pages).

Safavian et al.: "3-TFT active pixel sensor with correlated double sampling readout circuit for real-time medical x-ray imaging"; dated Jun. 2006 (4 pages).

Safavian et al.: "A novel current scaling active pixel sensor with correlated double sampling readout circuit for real time medical x-ray imaging"; dated May 2007 (7 pages).

Safavian et al.: "A novel hybrid active-passive pixel with correlated double sampling CMOS readout circuit for medical x-ray imaging"; dated May 2008 (4 pages).

Safavian et al.: "Self-compensated a-Si:H detector with current-mode readout circuit for digital X-ray fluoroscopy"; dated Aug. 2005 (4 pages).

Safavian et al.: "TFT active image sensor with current-mode readout circuit for digital x-ray fluoroscopy [5969D-82]"; dated Sep. 2005 (9 pages).

Sanford, James L., et al., "4.2 TFT AMOLED Pixel Circuits and Driving Methods", SID 03 Digest, ISSN/0003, 2003, pp. 10-13.

Stewart M. et al., "Polysilicon TFT technology for active matrix OLED displays" IEEE transactions on electron devices, vol. 48, No. 5; dated May 2001 (7 pages).

Tatsuya Sasaoka et al., 24.4L; Late-News Paper: A 13.0-inch AM-Oled Display with Top Emitting Structure and Adaptive Current Mode Programmed Pixel Circuit (TAC), SID 01 Digest, (2001), pp. 384-387.

Vygranenko et al.: "Stability of indium-oxide thin-film transistors by reactive ion beam assisted deposition"; dated 2009.

Wang et al.: "Indium oxides by reactive ion beam assisted evaporation: From material study to device application"; dated Mar. 2009 (6 pages).

Written Opinion dated Jul. 30, 2009 for International Application No. PCT/CA2009/000501 (6 pages).

Yi He et al., "Current-Source a-Si:H Thin Film Transistor Circuit for Active-Matrix Organic Light-Emitting Displays", IEEE Electron Device Letters, vol. 21, No. 12, Dec. 2000, pp. 590-592.

Zhiguo Meng et al; "24.3: Active-Matrix Organic Light-Emitting Diode Display implemented Using Metal-Induced Unilaterally Crystallized Polycrystalline Silicon Thin-Film Transistors", SID 01Digest, (2001), pp. 380-383.

International Search Report for Application No. PCT/IB2014/059409, Canadian Intellectual Property Office, dated Jun. 12, 2014 (4 pages).

Written Opinion for Application No. PCT/IB2014/059409, Canadian Intellectual Property Office, dated Jun. 12, 2014 (5 pages).

Extended European Search Report for Application No. EP 14181848.4, dated Mar. 5, 2015, (9 pages).

* cited by examiner

INTEGRATED GATE DRIVER

CROSS REFERENCE TO RELATED APPLICATION

This application claims the benefit of U.S. Provisional Application No. 61/969,533, filed Mar. 24, 2014, and U.S. Provisional Application No. 61/975,321, filed Apr. 4, 2014, each of which is hereby incorporated by reference herein in its entirety.

FIELD OF THE INVENTION

The present disclosure relates generally to AMOLED displays. More specifically, this disclosure relates to gate drivers suitable for integration into the back plane of an AMOLED display, which typically uses thin film transistors (TFTs).

BACKGROUND

Traditionally, when building AMOLED displays, it has been the practice to manufacture the display panel backplane and the gate drivers as separate devices. Doing so allows different manufacturing techniques to be applied to each case. If the same techniques could be used to manufacture the gate driver and the display itself, i.e., if the gate driver could be integrated into the back plane of the display, then they could be manufactured simultaneously with fewer components and less assembly required, leading to lower cost displays.

SUMMARY

In accordance with one embodiment, a gate driver suitable for integration with the backplane of an active matrix organic light emitting diode (AMOLED) display comprises clock signal sources producing first and second clock signals each having alternating active and inactive portions configured such that when one of the clock signals is active the other of the clock signals is inactive, and active portions of the first and second clock signals do not overlap; a daisy chain of circuits for producing gate signals, each of the circuits except the last circuit in the chain having an output coupled to the input of an adjacent circuit in the daisy chain; and a source of a start token signal coupled to an input of a first circuit in the daisy chain; wherein each of the circuits is configured to produce a gate signal one clock cycle after an active portion of one of the clock signals is received.

In one implementation, the gate driver is configured for use with an AMOLED display comprising p-type transistors so that an active signal corresponds to a low voltage and an inactive signal corresponds to a high voltage. The gate signals are active low for selecting or addressing p-type thin film transistors, or active high for selecting or addressing n-type thin film transistors.

Adjacent circuits in the daisy chain produce consecutive gate signals with a predetermined time interval between each pair of consecutive gate signals. The active portions of the first and second clock signals preferably have a predetermined time interval between them, to produce the predetermined time interval between each pair of consecutive gate signals.

In accordance with another embodiment, an integrated gate driver for performing emission operations comprises a source of first and second clock signals each, having alternating active and inactive portions configured such that when one is active the other is inactive and active signals do not overlap; a start token signal source and an inverse start token signal source for input into a first circuit block. Alternating odd and even circuit blocks are daisy chained together such that the output of one circuit block is connected to the input of the next circuit block, and each circuit block receives as inputs both first and second clock signals, wherein each circuit block is configured to produce an active output one clock cycle after an active signal is received and an inactive output at all other times. This gate driver may be configured for use with a display comprising p-type transistors so that an active signal corresponds with a high voltage and an inactive signal corresponds with a low voltage. The alternating circuit blocks are configured to select a line of pixels for two clock cycles in order to allow time for the pixels to settle before being programmed.

The foregoing and additional aspects and embodiments of the present disclosure will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the disclosure will become apparent upon reading the following detailed description and upon reference to the drawings.

Figure 1A:
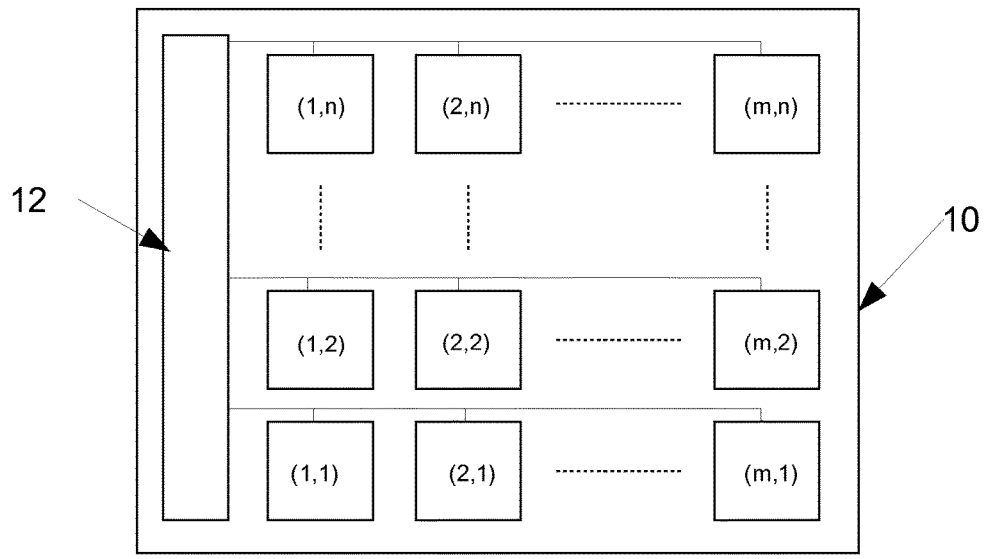
FIG. 1A is a block diagram of a display system using an integrated gate driver.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

Figure 1B:
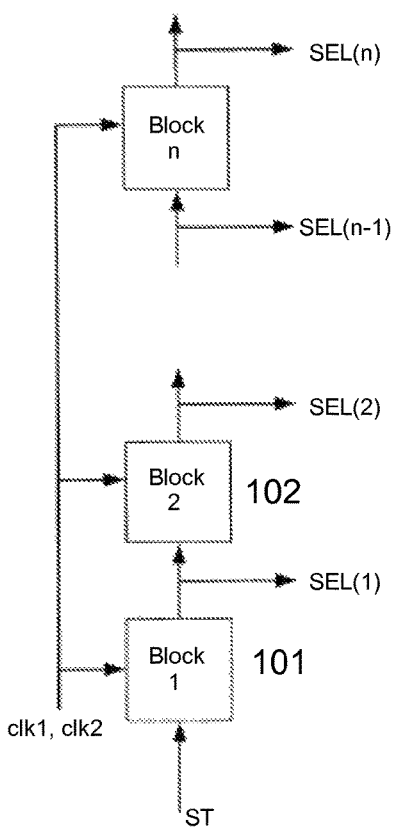
FIG. 1B is a block diagram of a select signal driver for the array of pixel circuits in the display of FIG. 1A.

FIG. 1A shows a display 10 for use with an integrated gate driver 12. Display 10 comprises an array (m×n) of pixels. FIG. 1B shows a block diagram of an integrated select signal driver 100 for the array of pixel circuits in the display of FIG. 1A. It should be noted that although select driver 100 is shown, and discussed below, as driving rows (1 to n), it may also be implemented to drive columns (1 to m). Select driver 100 comprises a series of alternating odd blocks 101 and even blocks 102 daisy chained together so that the output of each block, e.g., SEL(1), both drives its associated row of pixels and serves as an input to the following block. Accordingly, rows can be selected and driven in sequence. Other inputs clk1 and clk2 from clock signal sources are used to regulate timing and are discussed in greater detail below. A start token signal ST from a start token signal source is used to initiate the row driving sequence.

Exemplary embodiments of select driver 100 are discussed below. In each case, it is assumed that all transistors are p-type transistors, and are therefore active low devices. Those of skill in the art will understand that complementary circuit designs can be used with active high or n-type transistors. Alternatively, a combination of p-type and n-type devices may be used to implement select signal driver 100.

Figure 2A:
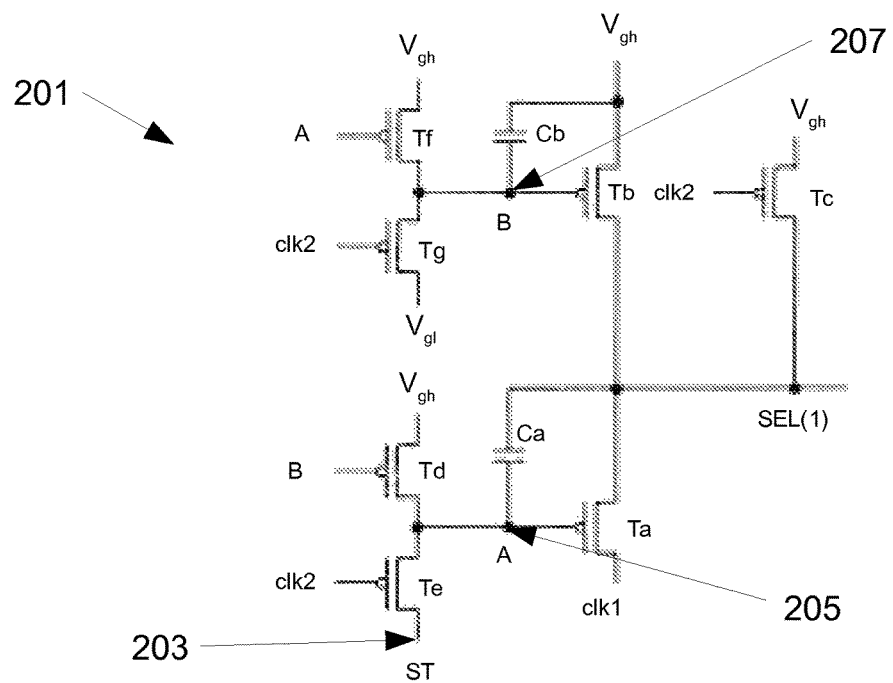
FIG. 2A is a circuit diagram of a circuit for use in an odd block of FIG. 1B when configured as an active low select signal driver.
Figure 2B:
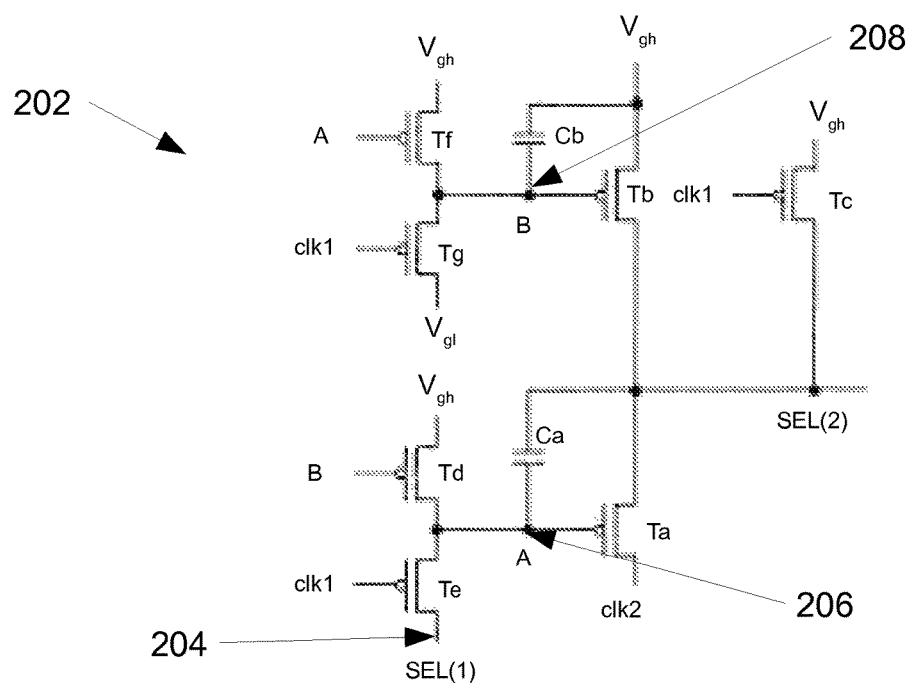
FIG. 2B is a circuit diagram of a circuit for use in an even block of FIG. 1B when configured as an active low select signal driver.

FIGS. 2A and 2B show circuit diagrams for use in odd blocks 201 and even blocks 202 corresponding to blocks 101 and 102 of FIG. 1B when configured as an active low select signal driver suitable for use as a select driver during read or write operations.

Physically, the circuit elements in odd blocks 201 and even blocks 202 are identical. The difference between odd blocks 201 and even blocks 202 is the inputs. The signals clk1 and clk2 play complementary roles in odd and even circuit blocks. It should be noted that in this implementation only one of clk1 and clk2 may be active at any given time; active clock signals do not overlap, but inactive clock signals may overlap during periods where the signals are transitioning. Other combinations of clk1 and clk2 may be used to achieve similar or extra functionality.

Figure 2C:
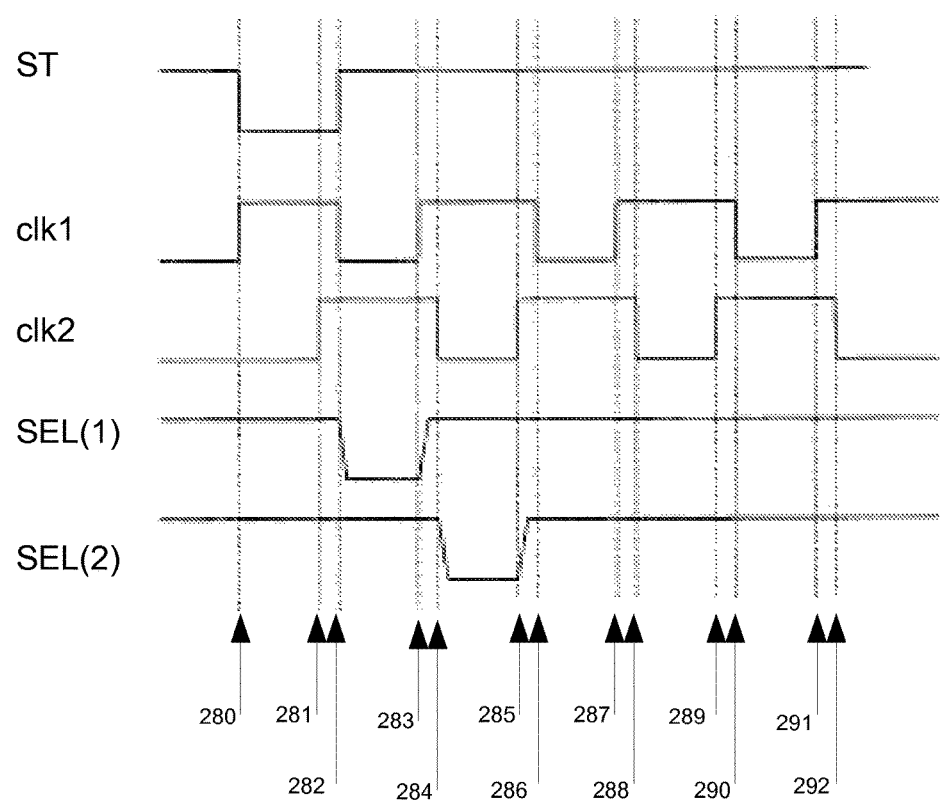
FIG. 2C is a timing diagram illustrating the operation of the circuits of FIGS. 2A and 2B.

In operation a sequence proceeds through several time periods, a subset of which is shown as 280 to 292 in FIG. 2C. It should be noted that some time periods are longer than others and that the sequence proceeds by alternating long and short periods. For example, a longer period 280-281 is followed by a short period 281-282 which is followed by a longer period 282-283. In actual operation, the number of time periods will be related to the number of rows in the display. $V_{gh}$ is a voltage that corresponds to a high, therefore inactive, signal while $V_{gl}$ corresponds to a low, therefore active, signal. $V_{gh}$ and $V_{gl}$ are either fixed or adjustable voltages provided by the power supply unit (not shown) of the display system 10.

Referring to FIGS. 2A and 2C, the operation of an odd block proceeds as follows. Block 1 will be described as an example.

At 280, Start Token (ST) and clk2 go low, therefore active, while clk1 goes high, therefore inactive. This causes transistor switches Tc, Te and Tg to close. The low ST signal will expose the bottom plate of capacitor Ca to a low signal, bring a low signal to point A 205 and cause transistor switches Ta and Tf to close. This allows a high signal to reach point B 207 which exposes the bottom plate of Cb to a high signal and causes transistor switches Tb and Td to open. Accordingly, SEL(1) goes out high as it is being fed from $V_{gh}$ via Tc and high clk1 via Ta.

At 281, clk2 goes high, causing Tc, Te and Tg to open.

At 282, clk1 goes low while ST goes high. ST will stay high for the remainder of the sequence. Capacitor Ca will maintain a low signal at point A 205 and keep Ta and Tf closed. Capacitor Cb will maintain a high signal at point B 207 and keep Tb and Td open. Accordingly, SEL(1) output will be low as it is being fed from low clk1 via Ta.

At 283, clk1 goes high causing SEL(1) to go high.

At 284, clk2 goes low causing Tc, Te and Tg to close. The high ST signal will expose the bottom plate of capacitor Ca to a high signal, bring a high signal to point A 205 and cause transistor switches Ta and Tf to open. This brings a low signal, $V_{gl}$, to point B 207 which exposes Cb to a low signal and causes Tb and Td to close. Accordingly, SEL(1) goes out high as it is being fed from $V_{gh}$ via Tb and Tc.

At 285, clk2 goes high causing Tc, Te and Tg to open.

At 286, clk1 goes low. Capacitor Ca will maintain a high signal at point A 205 and keep Ta and Tf open. Capacitor Cb will maintain a low signal at point B 207 and keep Tb and Td close. Accordingly, SEL(1) will remain high since it is being fed from $V_{gh}$ via Tb.

At 287, clk1 goes high.

Since ST will not change again until the entire sequence needs to be repeated, block 1 will simply repeat the pattern of 284 to 287 until the ST is changed, regardless of the state of clk1 and clk2. For example, the circuit will proceed through the same states from 288-291 as it did from 284-287 and SEL(1) will remain high.

Referring to FIGS. 2B and 2C, the operation of an even block proceeds as follows. Block 2 will be described as an example. It should be noted that the operation of an even block is complementary to the operation of an odd block in that clk1 and clk2 play opposite roles.

At 282, SEL(1) and clk1 go low, therefore active, while clk2 is high, therefore inactive. This causes transistor switches Tc, Te and Tg to close. The low SEL(1) signal will expose the bottom plate of capacitor Ca to a low signal, bring a low signal to point A 206 and cause transistor switches Ta and Tf to close. This allows a high signal to reach point B 208 which exposes the bottom plate of Cb to a high signal and causes Tb and Td to open. Accordingly, SEL(2) goes out high as it is being fed from $V_{gh}$ via Tc and high clk2 via Ta.

At 283, clk1 goes high, causing Tc, Te and Tg to open. SEL(1) will also go high and stay high for the remainder of the sequence. Capacitor Ca will maintain a low signal at point A 206 and keep Ta and Tf closed. Capacitor Cb will maintain a high signal at point B 208 and keep Tb and Td open.

At 284, SEL(2) and clk2 go low while SEL(1) remains high. Thus, there is a time interval (284-283) between clk1 going high and clk2 going low, and also between SEL(1) going high and SEL (2) going low.

At 285, clk2 goes high causing SEL(2) to go high.

At 286, clk1 goes low causing Tc, Te and Tg to close. The high SEL(1) signal will now expose the bottom plate of capacitor Ca to a high signal, bring a high signal to point A 206 and cause transistor switches Ta and Tf to open. This brings a low signal, $V_{gl}$, to point B 208 which exposes the bottom plate of Cb to a low signal and causes Tb and Td to close. Accordingly, SEL(2) goes out high as it is being fed from $V_{gh}$ via Tb and Tc.

At 287, clk1 goes high causing Tc, Te and Tg to open. Capacitor Ca will maintain a high signal at point A 206 and keep Ta and Tf open. Capacitor Cb will maintain a low signal at point B 208 and keep Tb and Td closed.

At 288, clk2 goes low. Accordingly, SEL(2) will remain high since it is being fed from $V_{gh}$ via Tb.

At 289, clk2 goes high.

Since SEL(1) will not change again until the entire sequence needs to be repeated, block 2 will simply repeat the pattern of 286 to 289, regardless of the state of clk1 and clk2, until SEL(1) changes. For example, the circuit will proceed through the same states from 290-293 as it did from 286-289 and SEL(2) will remain high.

All the odd blocks with follow the same pattern described for block 1 and all even block will follow the same pattern described for block 2, only delayed since the input of each block is the output of the previous block. In this way, each row of the display 10 may be selected and driven exclusively.

A pixel circuit in an (m×n) array, such as display system 10, may require multiple select signals to operate. An example of typical SEL signals used in a display system is write (WR), read (RD) and emission (EM). The circuits described above in FIGS. 2A-2C are suitable for WR and RD functions, but not for EM functions. Since emission is active low in a display comprising p-type transistors, a signal to tell a row to stop emitting will be active high.

Figure 3A:
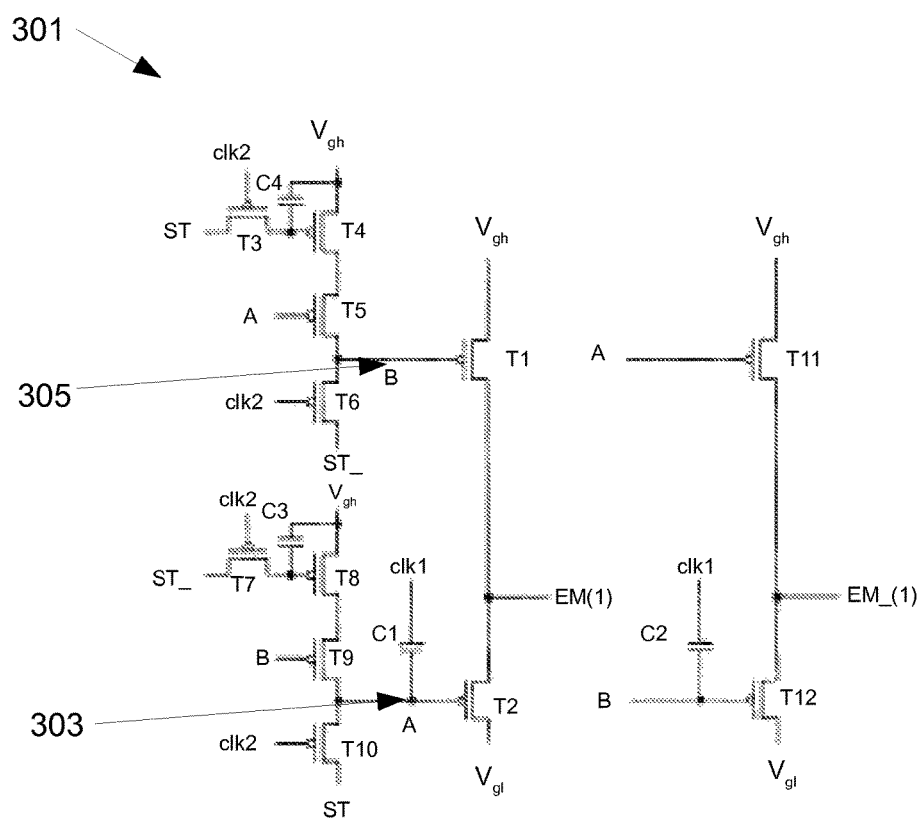
FIG. 3A is a circuit diagram of a circuit for use in an odd block of FIG. 1B when configured as an active high select signal driver.
Figure 3B:
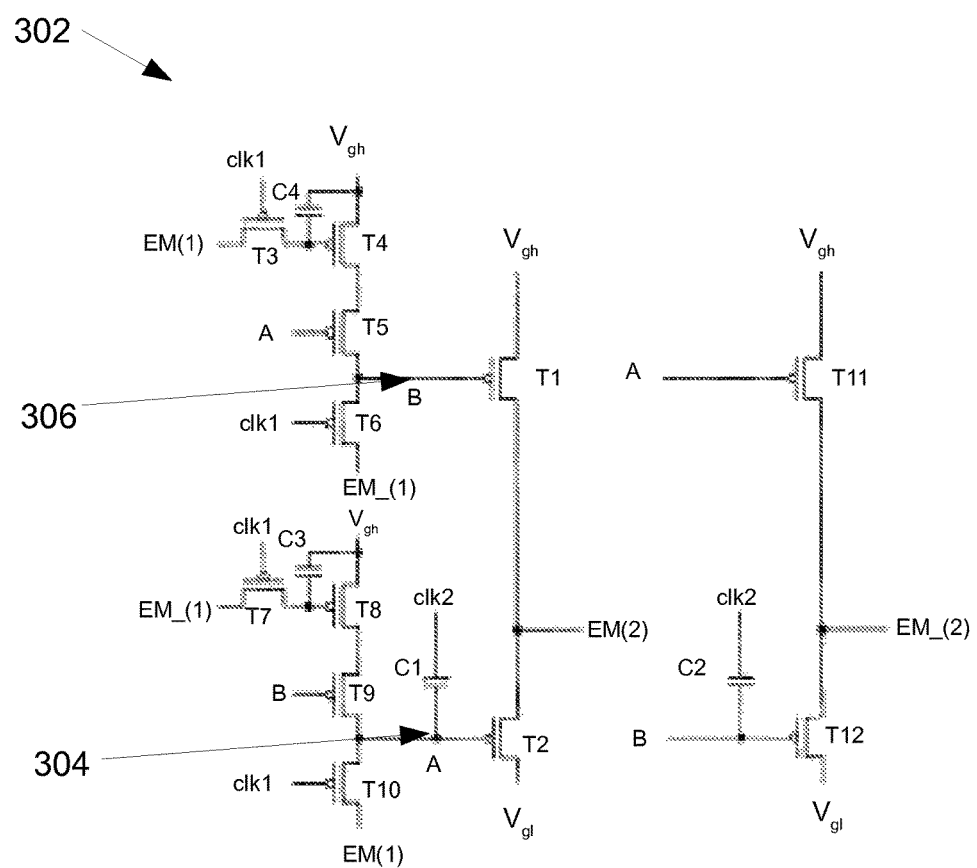
FIG. 3B is a circuit diagram of a circuit for use in an even block of FIG. 1B when configured as an active high select signal driver.

FIGS. 3A and 3B show circuit diagrams for use in odd blocks 301 and even blocks 302 corresponding to 101 and 102 in FIG. 1B when configured as an active high select signal driver. Note that the circuits of FIGS. 3A and 3B are designed to hold EM signals high for twice as long in order to allow time for the components in the pixels to settle before programming.

Physically, the circuit elements in odd blocks 301 and even blocks 302 are identical. The difference between odd blocks 301 and even blocks 302 is the inputs. Clk1 and clk2 play complementary roles in odd/even blocks. It should be noted that only one of clk1 and clk2 may be active at any given time in this implementation; active clock signals do not overlap. Other combinations of clk1 and clk2 may be used to achieve similar or extra functionality.

Figure 3C:
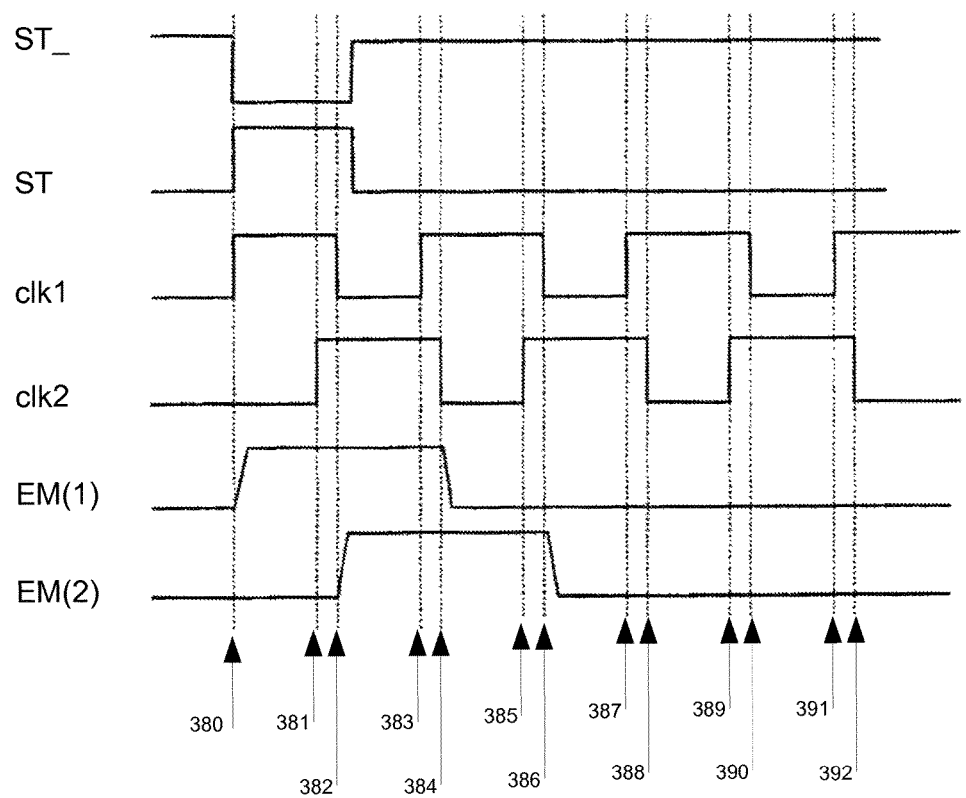
FIG. 3C is a timing diagram illustrating the operation of circuits of FIGS. 3A and 3B.

In operation a sequence proceeds through several time periods, a subset of which are shown as 380 to 392 in FIG. 3C. It should be noted that some time periods are longer than others and that the sequence proceeds by alternating long and short periods. For example, a longer period 380-381 is followed by a short period 381-382 which is followed by a longer period 382-383. In actual operation, the number of time periods will be related to the number of rows in the display system 10. $V_{gh}$ is a voltage that corresponds to a high, therefore inactive state, signal while $V_{gl}$ corresponds to a low, therefore active state, signal.

Referring to FIGS. 3A and 3C, the operation of an odd block proceeds as follows. Block 1 will be described as an example. Note that an underscore, "_" indicates a signal in an inverse state. For example, ST and ST_ will always have inverse states; ST_ will be low when ST is high and vice versa.

At 380, ST_ and clk2 go low, while ST and clk1 go high. This causes transistor switches T3, T6, T7 and T10 to close. The high ST signal will expose the bottom plate of capacitor C4 to a high signal, cause T4 to open and bring a high signal to point A 303 which exposes the bottom plate of C1 to a high signal and causes T11, T5 and T2 to open. The low ST_ signal will expose the bottom plate of capacitor C3 to a low signal and cause transistor switch T8 to close and bring a low signal to point B 305 which exposes the bottom plate of C2 to a low signal and causes T12, T9 and T1 to close. Accordingly, EM(1) will be high and EM_(1) will be low.

At 381, clk2 goes high, causing transistors T3, T6, T7 and T10 to close, effectively shutting out ST and ST_signals. Capacitor C4 will maintain a high signal and keep T4 open while C3 will maintain a low signal and keeps T8 closed. Capacitor C2 will maintain a low signal at point B 305 and keep transistors T12, T1 and T9 closed while C1 maintains a high signal at point A 303 and keeps T11, T2 and T5 open. Accordingly, EM(1) will remain high while EM_(1) will remain low.

At 382, clk1 goes low but has no effect on the output of block 1, EM(1) and EM_(1). Before 383, ST goes low and ST_ goes high, but has no effect since the transistors controlled by clk2 are closed.

At 383, clk1 goes high.

At 384, clk2 goes low causing transistor switches T3, T6, T7 and T10 to close. The low ST signal will expose the bottom plate of capacitor C4 to a low signal, cause T4 to close and bring a low signal to point A 303 which exposes the bottom plate of C1 to a low signal and causes T2, T5 and T11 to close. The high ST_signal will expose the bottom plate of capacitor C3 to a high signal, cause T8 to open and bring a high signal to point B 305 which exposes the bottom plate of C2 to a high signal and causes T1, T9 and T12 to open. Consequently, EM(1) will turn low while EM_(1) turns high.

At 385, clk2 goes high, causing T3, T6, T7 and T10 to close. Capacitor C4 will maintain a low signal and keep T4 closed while C3 maintains a high signal and keeps T8 open. Capacitor C2 will maintain a high signal at point B 305 and keep transistor switches T1, T9 and T12 open while C1 maintains a low signal at point A 303 and keeps T2, T5 and T11 closed. Accordingly, EM(1) will remain low while EM_(1) remains high.

At 386, clk1 goes low.

At 387, clk1 goes high but has not effect on the output of block 1, EM(1) and EM_(1).

Since ST and ST_ inputs will not change again until the entire sequence needs to be repeated, block 1 will simply repeat the pattern of 384 to 387, regardless of the state of clk1 and clk2, until the inputs are changed. For example, the circuit will proceed through the same states from 388-391 as it did from 384-387. EM(1) will remain low and EM_(1) will remain high.

Referring to FIGS. 3B and 3C, the operation of an even block proceeds as follows. Block 2 will be described as an example.

At 382, EM_(1) and clk2 go low while EM(1) and clk1 go high. This causes T3, T6, T7 and T10 to close. The high EM(1) signal will expose the bottom plate of capacitor C4 to a high signal, cause T4 to open and bring a high signal to point A 304 which exposes the bottom plate of C1 to a high signal and causes T11, T5 and T2 to open. The low EM_(1) signal will expose the bottom plate of capacitor C3 to a low signal and cause transistor T8 to close and bring a low signal to point B 306 which exposes the bottom plate of C2 to a low signal and causes T12, T9 and T1 to close. Accordingly, EM(2) will go high and EM_(2) will turn low.

At 383, clk1 goes high, causing transistors T3, T6, T7 and T10 to open, effectively isolating the EM(1) and EM_(1) signals into block 2. Capacitor C4 will maintain a high signal and keep T4 open while C3 will maintain a low signal and keep T8 closed. Capacitor C2 will maintain a low signal at point B 306 and keep transistor switches T12, T1 and T9 closed while C1 maintains a high signal at point A 304 and keeps T11, T2 and T5 open. Accordingly, EM(2) will remain high while EM_(2) will remain low.

At 384, clk2 goes low but has not effect on the output, EM(2) and EM(_(2), of block 2.

At 385, clk2 goes high, which also has no effect on the output of block 2.

At 386 clk1 goes low causing transistor switches T3, T6, T7 and T10 to close. The low EM(1) signal will expose the bottom plate of capacitor C4 to a low signal, cause T4 to close and bring a low signal to point A 304 which exposes the bottom plate of C1 to a low signal and causes T2, T5 and T11 to close. The high EM_(1) signal will expose the bottom plate of capacitor C3 to a high signal, cause T8 to open and bring a high signal to point B 306 which exposes the bottom plate of C2 to a high signal and causes T1, T9 and T12 to open. Accordingly, EM(2) will turn low while EM_(2) turns high.

At 387, clk1 goes high, causing T3, T6, T7 and T10 to close. Capacitor C4 will maintain a low signal and keep T4 closed while C3 maintains a high signal and keeps T8 open. Capacitor C2 will maintain a high signal at point B 306 and keep transistors T1, T9 and T12 open while C1 maintains a low signal at point A 304 and keeps T2, T5 and T11 closed. Accordingly, EM(2) will remain low while EM_(2) remains high.

At 388, clk2 goes low and has no effect on the output of block 2.

At 389, clk1 goes high and also has no effect on the output of block 2.

Since EM(1) and EM_(1) inputs will not change again until the entire sequence needs to be repeated, block 2 will simply repeat the pattern of 386 to 389, regardless of the state of clk1 and clk2, until the inputs are changed. For example, the circuit will proceed through the same states from 390-393 as it did from 386-389. EM(2) will remain low and EM_(2) will remain high.

An analogous pattern will occur in subsequent odd blocks. A complementary analogous pattern, with clk1 and clk2 playing opposite roles, will occur in subsequent even blocks.

Figure 4A:
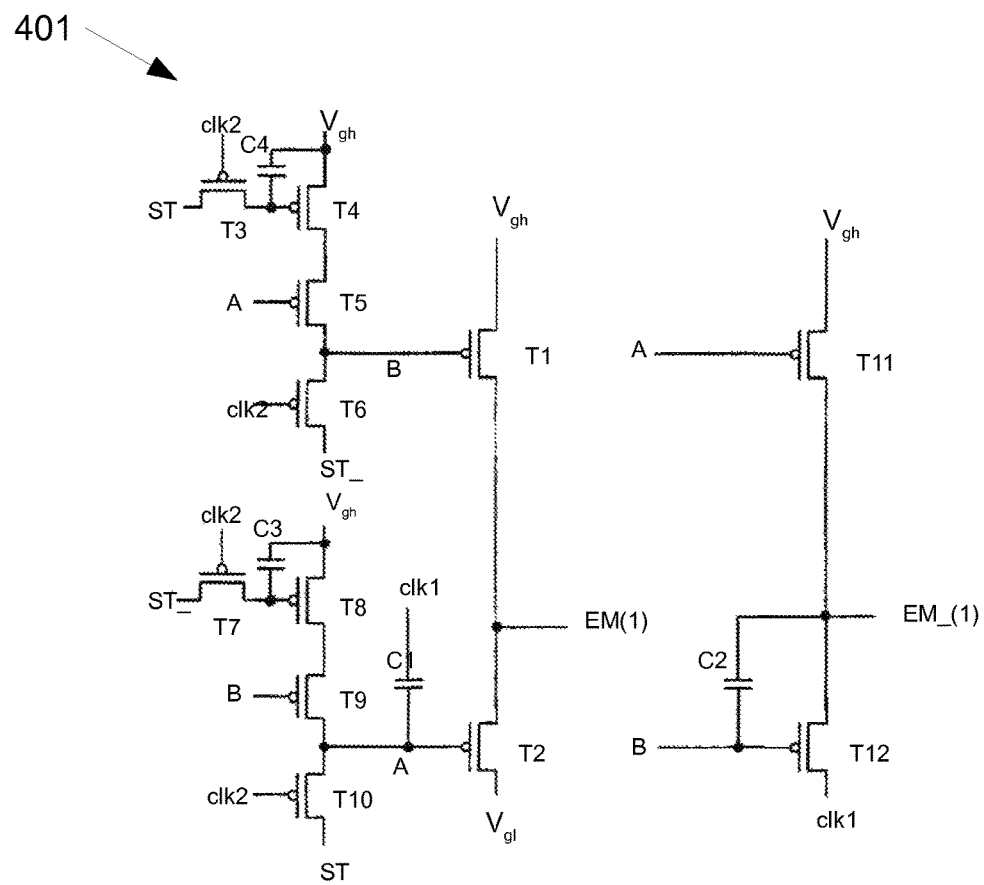
FIG. 4A is a circuit diagram of a second circuit for use in an odd block of FIG. 1B when configured as an active high select signal driver.
Figure 4B:
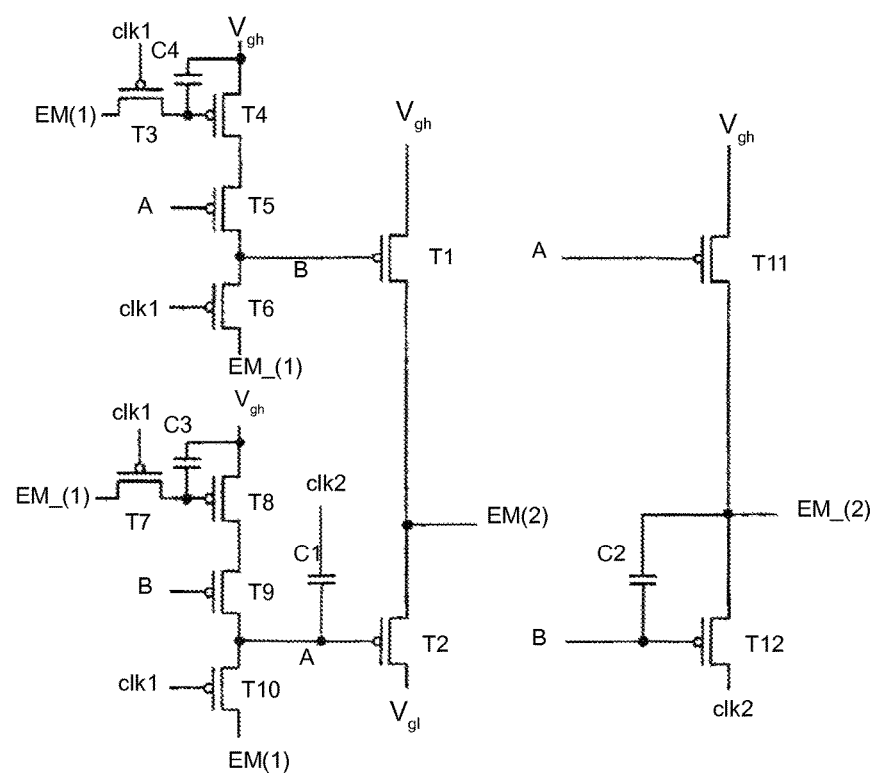
FIG. 4B is a circuit diagram of a second circuit for use in an even block of FIG. 1B when configured as an active high select signal driver.

FIGS. 4A and 4B show circuit diagrams of a second embodiment of odd blocks 401 and even blocks 402 of FIG. 1B when configured as an active high select signal driver. The circuits of FIGS. 4A and 4B are identical to those of FIGS. 3A and 3B except for one connection of capacitor C2. In FIGS. 4A and 4B the terminals of C2 are connected to point B and the EM_ output rather than point B and clk1 or clk2. Clk1 and clk2 now drive EM_(1) through T12. The timing diagram of FIG. 3C also applies to the circuits in FIGS. 4 and 4B.

It has been found that the circuits of FIGS. 4A and 4B are better able to handle variations in T12 than those shown in FIGS. 3A and 3B.

Figure 5A:
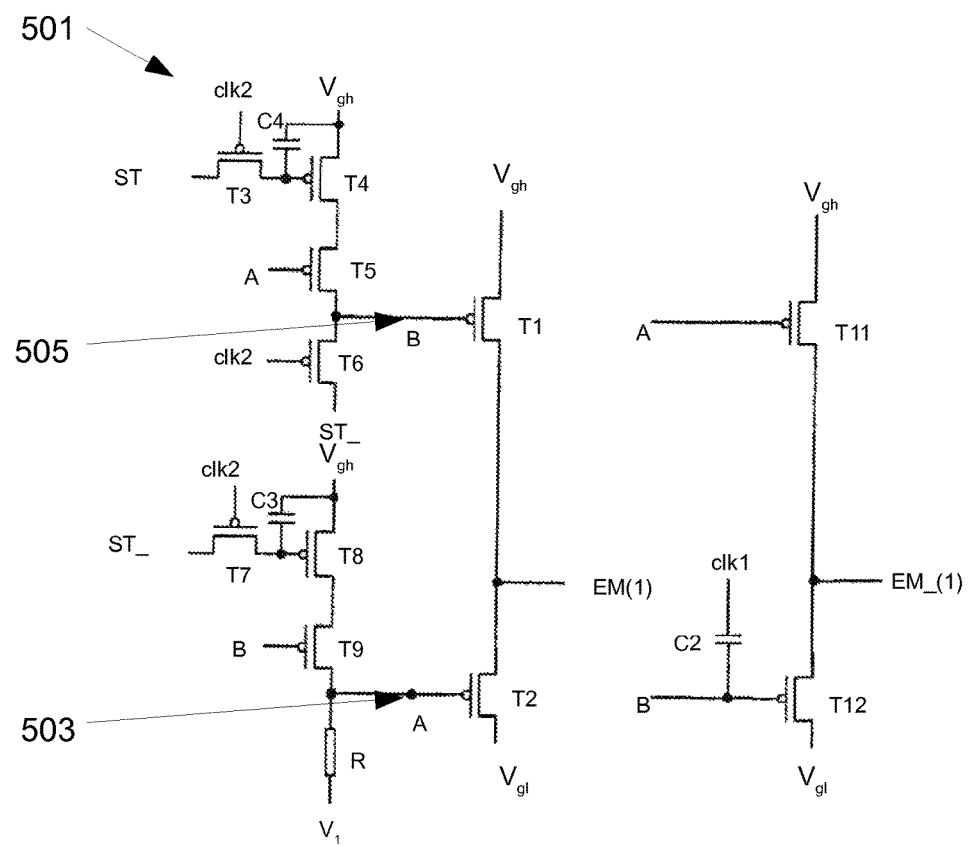
FIG. 5A is a circuit diagram of a third circuit for use in an odd block of FIG. 1B when configured as an active high select signal driver.
Figure 5B:
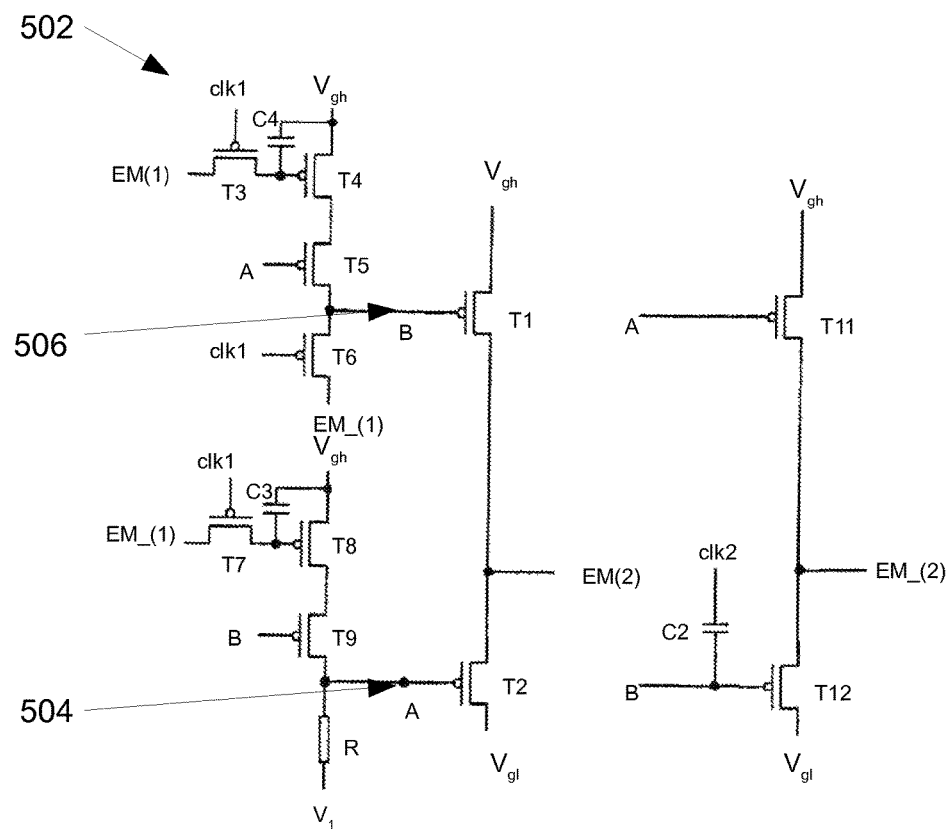
FIG. 5B is a circuit diagram of a third circuit for use in an even block of FIG. 1B when configured as an active high select signal driver.

FIGS. 5A and 5B show circuit diagrams of a third embodiment of odd blocks 501 and even blocks 502, corresponding to 101 and 102 of FIG. 1B, when configured as an active high select signal driver. The circuits of FIGS. 5A and 5B are identical to those of FIGS. 3A and 3B except that C1 has been removed and T10 has been replaced by a resistance, R, connected to voltage $V_1$, where $V_1 < V_{gl}$. The circuits shown in FIGS. 5A and 5B provide a more stable voltage at point A.

Physically, the circuit elements in odd blocks 501 and even blocks 502 are identical. The difference between odd blocks 501 and even blocks 502 is the inputs. Clk1 and clk2 play complementary roles in odd/even blocks. It should be noted that only one of clk1 and clk2 may be active at any given time in this implementation; active clock signals do not overlap. Other combination of clk1 and clk2 may be used to achieve similar or extra functionality.

In operation, a sequence proceeds through several time periods, a subset of which are shown as 380 to 392 in FIG. 3C. It should be noted that some time periods are longer than others and that the sequence proceeds by alternating long and short periods. For example, a longer period, 380-381, is followed by a short period, 381-382 which is followed by a longer period, 382-383. In actual operation, the number of time periods will be related to the number of rows in display system 10. $V_{gh}$ is a voltage that corresponds to a high, therefore inactive state, signal while $V_{gl}$ corresponds to a low, therefore active state, signal and $V_1 < V_{gl}$.

Referring to FIGS. 5A and 3C, the operation of an odd block proceeds as follows. Block 1 will be described as an example. Note that a "_" indicates an inverse state. For example, ST and ST_ will always have inverse states; ST_ will be low when ST is high and vice versa.

At 380, ST_goes low, while ST and clk1 go high. Clk2 is also low at this time. This causes transistors T3, T6 and T7 to close. The high ST signal will expose the bottom plate of capacitor C4 to a high signal and cause T4 to open. The low ST signal will expose the bottom plate of capacitor C3 to a low signal and cause T8 to close and bring a low signal to point B 505 which exposes the bottom plate of C2 to a low signal and causes T12, T9 and T1 to close. Since T8 and T9 are closed, and by design the on-resistance of T8 and T9 is much less than R, a high signal reaches point A, exposes the bottom plate of C1 to a high signal and causes T11, T5 and T2 to open. Accordingly, EM(1) will be high and EM_(1) will be low.

At 381, clk2 goes high, causing transistors T3, T6 and T7 to open, effectively shutting out ST and ST_ signals. Capacitor C4 will maintain a high signal and keep T4 open while C3 will maintain a low signal and keep T8 closed. Capacitor C2 will maintain a low signal at point B 505 and keep T12, T1 and T9 closed. Since T8 and T9 are closed, and by design the on-resistance of T8 and T9 is much less than R, a high signal reaches point A 503, exposes the bottom plate of C1 to a high signal and causes T11, T5 and T2 to open. Accordingly, EM(1) will remain high while EM_(1) will remain low.

At 382, clk1 goes low. Before 383, ST goes low and ST_ goes high, but has no effect since the transistors controlled by clk2 are open.

At 383, clk1 goes high.

At 384 clk2 goes low causing T3, T6 and T7 to close. The low ST signal will expose the bottom plate of capacitor C4 to a low signal and cause T4 to close. The high ST_signal will expose the bottom plate of capacitor C3 to a high signal, cause T8 to open and bring a high signal to point B 505 which exposes the bottom plate of C2 to a high signal and causes T1, T9 and T12 to open. Since T8 and T9 are open, $V_1$ is the only signal source able to reach point A 503. This brings a low signal to point A 503 which causes T2, T5 and T11 to close. Accordingly, EM(1) will turn low while EM_(1) turns high.

At 385, clk2 goes high, causing T3, T6 and T7 to open. Capacitor C4 will maintain a low signal and keep T4 closed while C3 maintains a high signal and keeps T8 open. Capacitor C2 will maintain a high signal at point B 505 and keep T1, T9 and T12 open. Since T8 and T9 are open, $V_1$ is the only signal source able to reach point A 503. This brings a low signal to point A 503 which causes T2, T5 and T11 to close. Accordingly, EM(1) will remain low while EM_(1) remains high.

At 386, clk1 goes low.

At 387, clk1 goes high and has no effect on the outputs of block 1.

Since ST and ST_ inputs will not change again until the entire sequence needs to be repeated, block 1 will simply repeat the pattern of 384 to 387, regardless of the state of clk1 and clk2, until the inputs are changed. For example, the circuit will proceed through the same states from 388-391 as it did from 384-387. EM(1) will remain low and EM_(1) will remain high.

Referring to FIGS. 5B and 3C, the operation of an even block proceeds as follows. Block 2 will be described as an example.

At 382, clk1 goes low, while EM(1) and clk2 are high. EM_(1) is also low at this time. This causes T3, T6 and T7 to close. The high EM(1) signal will expose the bottom plate of capacitor C4 to a high signal and cause T4 to open. The low EM_(1) signal will expose the bottom plate of capacitor C3 to a low signal, cause T8 to close and bring a low signal to point B 506 which exposes the bottom plate of C2 to a low signal and causes T12, T9 and T1 to close. Since T8 and T9 are closed, and by design the on-resistance of T8 and T9 is much less than R, a high signal reaches point A 504, exposes the bottom plate of C1 to a high signal and causes T11, T5 and T2 to open. Accordingly, EM(2) will go high and EM_(2) will turn low.

At 383, clk1 goes high, causing transistors T3, T6 and T7 to open, effectively isolating the EM(1) and EM_(1) signals. Capacitor C4 will maintain a high signal and keep T4 open while C3 will maintain a low signal and keep T8 closed. Capacitor C2 will maintain a low signal at point B 506 and keep transistors T12, T1 and T9 closed. Since T8 and T9 are closed, and by design the on-resistance of T8 and T9 is much less than R, a high signal reaches point A 504, exposes the bottom plate of C1 to a high signal and causes T11, T5 and T2 to open. Accordingly, EM(2) will remain high while EM_(2) remains low.

At 384, clk2 goes low and has no effect on the output of block 2.

At 385, clk2 goes high which also has no effect on the output of block 2.

At 386 clk1 goes low causing T3, T6 and T7 to close. The low EM(1) signal will expose the bottom plate of capacitor C4 to a low signal and cause T4 to close. The high EM_(1) signal will expose capacitor the bottom plate of C3 to a high signal, cause T8 to open and bring a high signal to point B 506 which exposes the bottom plate of C2 to a high signal and causes T1, T9 and T12 to open. Since T8 and T9 are open, V$_1$ is the only signal source able to reach point A 504. This brings a low signal to point A 504 which causes T2, T5 and T11 to close. Accordingly, EM(2) will turn low while EM_(2) turns high.

At 387, clk1 goes high, causing T3, T6 and T7 to open. Capacitor C4 will maintain a low signal and keep T4 closed while C3 maintains a high signal and keeps T8 open. Capacitor C2 will maintain a high signal at point B 506 and keep T1, T9 and T12 open. Since T8 and T9 are open, V$_1$ is the only signal source able to reach point A 504. This brings a low signal to point A 504 which causes T2, T5 and T11 to close. Accordingly, EM(2) will remain low while EM_(2) remains high.

At 388, clk2 goes low and has no effect on the output of block 2.

At 389, clk1 goes high and also has no effect on the output of block 2.

Since EM(1) and EM (1) inputs will not change again until the entire sequence needs to be repeated, block 2 will simply repeat the pattern of 386 to 389, regardless of the state of clk1 and clk2, until the inputs are changed. For example, the circuit will proceed through the same states from 390-393 as it did from 386-389. EM(2) will remain low and EM_(2) will remain high.

An analogous pattern will occur in subsequent odd blocks. A complementary analogous pattern, with clk1 and clk2 playing opposite roles, will occur in subsequent even blocks.

Other permutations of the circuits shown in FIGS. 5A and 5B include: making resistance R an active element and replacing T5 and T9 with directed connections between their adjacent transistors.

In a display system 10 implementing the integrated gate driver described in FIG. 3, 4 or 5 under normal operating conditions, each row of pixels will be in turn, off and being allowed to settle, off and being programmed and on and emitting. Accordingly, at any given time, one row will be off and settling, one row will be off and being programmed and the remainder will be emitting according to their last programmed state.

Additional functionality can be achieved by varying the inputs. For example, a power-on function, a light-on function and a gate output enable (GOE) function are all possible with any of the circuits described above.

A power-on function can be used whenever display system 10 is first powered up or at any other time that a simultaneous reset of all SEL outputs is desired. In the circuits of FIGS. 2A and 2B, if clk1, clk2 and V$_{gl}$ are set low while V$_{gh}$ and ST are set high then the inactive signal will propagate to the entire SEL(1) to SEL(n) of display system 10 and all SEL signals will be deactivated. In the circuits of FIGS. 3A, 3B, 4A, 4B, 5A, and 5B, if clk1, clk2, V$_{gl}$ and ST_ are set low while V$_{gh}$ and ST are set high the same result will be achieved. V$_1$ can be allowed to float during this operation.

A light-on function can be used to test the functionality of all the pixels by selecting and driving all rows simultaneously. In the circuits of FIGS. 2A and 2B this can be achieved by setting all of the inputs, clk1, clk2, V$_{gl}$, V$_{gh}$ and ST to low. Light-on can be achieved in the circuits of FIGS. 3A, 3B, 4A, 4B, 5A and 5B by setting inputs clk1, clk2, V$_{gl}$, V$_{gh}$, ST and ST_ to low. V$_1$ can be allowed to float.

A GOE (gate output enable) function allows an active SEL line to be momentarily deactivated even when a token is present. This can be achieved by altering the clk1 signal input for odd blocks or the clk2 signal input for even blocks. For example, consider the circuit of FIG. 2A, an odd block, as it reaches time 284. Normally, clk2 would rise at 284 causing the token to shift into the next block. However, if clk2 is instead held high, a GOE function can be realized. In this situation, if clk1 goes low again, SEL(1) will be reactivated. This can be used to implement in-pixel compensation or to read out pixel characteristics for external compensation.

While particular implementations and applications of the present disclosure have been illustrated and described, it is to be understood that the present disclosure is not limited to the precise construction and compositions disclosed herein and that various modifications, changes, and variations can be apparent from the foregoing descriptions without departing from the spirit and scope of an invention as defined in the appended claims.

What is claimed is:

1. A gate driver suitable for integration with the backplane of an active matrix organic light emitting diode (AMOLED) display, said gate driver comprising clock signal sources producing first and second clock signals each having alternating active and inactive portions configured such that when one of said clock signals is active the other of said clock signals is inactive, and active portions of said first and second clock signals do not overlap;

a daisy chain of more than two circuits integrated within said backplane and for producing gate signals, each of said circuits including capacitors and thin film transistors and substantially physically identical to one another and receiving as inputs both said first and second clock signals, each of said circuits receiving over first one or more clock inputs one of said first and second clock signals and receiving over second one or more clock inputs the other of said first and second clock signals, the first one or more clock inputs of each circuit receiving the same clock signal as the second one or more clock inputs of adjacent circuits, and the second one or more clock inputs of each circuit receiving the same clock signal as the first one or more clock inputs of adjacent circuits, each of said circuits except the first circuit in the daisy chain receiving as the only input from said circuits, one or more gate signal outputs, all from only one adjacent circuit of said circuits, and each of said circuits except the last circuit in the daisy chain having an output coupled to an input of an adjacent circuit in the daisy chain; and a source of a start token signal coupled to an input of the first circuit in said daisy chain; wherein each of said circuits is configured to produce a gate signal one clock cycle after an active portion of one of said clock signals is received.

2. The gate driver of claim 1 which is configured for use with an AMOLED display comprising p-type transistors so that an active signal corresponds to a low voltage and an inactive signal corresponds to a high voltage.

3. The gate driver of claim 1 in which said gate signals are active low for selecting or addressing p-type thin film transistors.

4. The gate driver of claim 1 in which said gate signals are active high for selecting or addressing n-type thin film transistors.

5. The gate driver of claim 1 in which said circuits produce consecutive gate signals with a predetermined time gap between each pair of consecutive gate signals.

6. The gate driver of claim 5 in which said active portions of said first and second clock signals have a predetermined time gap between them, to produce said time gap between each pair of consecutive gate signals.

7. An integrated gate driver for performing emission operations of a display, the gate driver comprising:

a source of first and second clock signals each, having alternating active and inactive portions configured such that when one is active the other is inactive and active signals do not overlap;

a source for a start token signal and an inverse start token signal for input into a first circuit block;

integrated within a backplane of the display alternating odd and even circuit blocks of more than two circuit blocks daisy chained together such that an output of one circuit block is connected to an input of the next circuit block and each circuit block receives as inputs both first and second clock signals, each odd and even circuit block including capacitors and thin film transistors and substantially physically identical to one another, each of said circuit blocks receiving over first one or more clock inputs one of said first and second clock signals and receiving over second one or more clock inputs the other of said first and second clock signal, the first one or more clock inputs of each odd circuit block receiving the same clock signal as the second one or more clock inputs of each even circuit block, and the second one or more clock inputs of each odd circuit block receiving the same clock signal as the first one or more clock inputs of each even circuit block, each of said circuit blocks except the first circuit block in the chain receiving as the only input from said circuit blocks, one or more gate signal outputs, all from only one adjacent circuit block of said circuit blocks, wherein each circuit block is configured to produce an active output one clock cycle after an active signal is received and an inactive output at all other times.

8. The integrated gate driver of claim 7 configured for use with a display comprising p-type transistors so that an active signal corresponds with a high voltage and an inactive signal corresponds with a low voltage.

9. The integrated gate driver of claim 7 wherein the alternating circuit blocks are configured to select a line of pixels for two clock cycles in order to allow time for the pixels to settle before being programmed.

10. A method of producing gate signals from a gate driver integrated with the backplane of an active matrix organic light emitting diode (AMOLED) display, said method comprising producing first and second clock signals each having alternating active and inactive portions configured such that when one of said clock signals is active the other of said clock signals is inactive, and active portions of said first and second clock signals do not overlap;

producing gate signals from a daisy chain of more than two circuits integrated within said backplane, each of said circuits including capacitors and thin film transistors and substantially physically identical to one another and receiving as inputs both said first and second clock signals, each of said circuits receiving over first one or more clock inputs one of said first and second clock signals and receiving over second one or more clock inputs the other of said first and second clock signals, the first one or more clock inputs of each circuit receiving the same clock signal as the second one or more clock inputs of adjacent circuits, and the second one or more clock inputs of each circuit receiving the same clock signal as the first one or more clock inputs of adjacent circuits, each of said circuits except the first circuit in the daisy chain receiving as the only input from said circuits, one or more gate signal outputs, all from only one adjacent circuit of said circuits, and each of said circuits except the last circuit in the daisy chain having an output coupled to an input of an adjacent circuit in the daisy chain;

supplying a start token signal to an input of a first circuit in said daisy chain; and producing a gate signal from each of said circuits, each gate signal being produced one clock cycle after said start token signal or an active portion of one of said clock signals is received.

11. The method of claim 10 in which the AMOLED display comprises p-type transistors so that an active signal corresponds to a low voltage and an inactive signal corresponds to a high voltage.

12. The method of claim 10 in which said gate signals are active low for selecting or addressing p-type thin film transistors.

13. The method of claim 10 in which said gate signals are active high for selecting or addressing n-type thin film transistors.

14. The method of claim 10 which produces consecutive gate signals with a predetermined time gap between each pair of consecutive gate signals.

15. The method of claim 14 in which said active portions of said first and second clock signals have a predetermined time gap between them, to produce said time gap between each pair of consecutive gate signals.

* * * * *